(12) United States Patent
Aruga et al.

(10) Patent No.: US 8,063,471 B2
(45) Date of Patent: Nov. 22, 2011

(54) COPPER ALLOY SHEET FOR ELECTRIC AND ELECTRONIC PARTS

(75) Inventors: Yasuhiro Aruga, Kobe (JP); Ryoichi Ozaki, Shimonoseki (JP); Yosuke Miwa, Shomonoseki (JP)

(73) Assignee: Kobe Steel, Ltd., Kobe-shi (JP)

( * ) Notice: Subject to any disclaimer, the term of this patent is extended or adjusted under 35 U.S.C. 154(b) by 206 days.

(21) Appl. No.: 12/441,904

(22) PCT Filed: Sep. 26, 2007

(86) PCT No.: PCT/JP2007/068670
§ 371 (c)(1),
(2), (4) Date: Mar. 19, 2009

(87) PCT Pub. No.: WO2008/041584
PCT Pub. Date: Apr. 10, 2008

(65) Prior Publication Data
US 2010/0072584 A1  Mar. 25, 2010

(30) Foreign Application Priority Data

| Oct. 2, 2006 | (JP) | 2006-270918 |
| Oct. 5, 2006 | (JP) | 2006-274309 |
| Nov. 17, 2006 | (JP) | 2006-311899 |
| Nov. 17, 2006 | (JP) | 2006-311900 |

(51) Int. Cl.
| H01L 23/495 | (2006.01) |
| H01L 23/48 | (2006.01) |
| H01L 23/52 | (2006.01) |
| H01L 29/40 | (2006.01) |

(52) U.S. Cl. .. 257/666; 257/677; 257/762; 257/E23.161

(58) Field of Classification Search .................. 257/666, 257/677, 762, E23.161
See application file for complete search history.

(56) References Cited

U.S. PATENT DOCUMENTS

| 3,868,279 | A | * | 2/1975 | Nachman et al. | 148/686 |
| 4,047,978 | A | * | 9/1977 | Parikh et al. | 148/684 |
| 4,110,132 | A | * | 8/1978 | Parikh et al. | 148/434 |
| 4,851,191 | A | * | 7/1989 | Lee et al. | 420/471 |
| 6,569,543 | B2 | * | 5/2003 | Brenneman et al. | 428/607 |
| 7,022,419 | B2 | * | 4/2006 | Ishigami et al. | 428/635 |
| 7,381,475 | B2 | * | 6/2008 | Suzuki | 428/553 |
| 2002/0012603 | A1 | | 1/2002 | Miwa | |
| 2003/0211357 | A1 | * | 11/2003 | Harada et al. | 428/687 |
| 2004/0076832 | A1 | | 4/2004 | Nagai et al. | |
| 2005/0092404 | A1 | | 5/2005 | Aruga et al. | |
| 2005/0161126 | A1 | | 7/2005 | Aruga et al. | |
| 2005/0181228 | A1 | * | 8/2005 | McCullough et al. | 428/611 |
| 2006/0137773 | A1 | | 6/2006 | Aruga et al. | |
| 2007/0148032 | A1 | | 6/2007 | Aruga et al. | |
| 2008/0025867 | A1 | | 1/2008 | Aruga et al. | |
| 2009/0010797 | A1 | | 1/2009 | Aruga et al. | |
| 2010/0276037 | A1 | * | 11/2010 | Yamamoto et al. | 148/501 |

FOREIGN PATENT DOCUMENTS

| JP | 2 122035 | 5/1990 |
| JP | 2 145734 | 6/1990 |
| JP | 2 170935 | 7/1990 |
| JP | 6 235035 | 8/1994 |
| JP | 7 242965 | 9/1995 |
| JP | 2000 104131 | 4/2000 |
| JP | 2000 328157 | 11/2000 |
| JP | 2000 328158 | 11/2000 |
| JP | 2000 328159 | 11/2000 |
| JP | 2001 244400 | 9/2001 |
| JP | 2001 279347 | 10/2001 |
| JP | 2002 266042 | 9/2002 |
| JP | 2002 339028 | 11/2002 |
| JP | 2005 139501 | 6/2005 |
| JP | 2005 206891 | 8/2005 |
| JP | 2006 63431 | 3/2006 |
| JP | 2006 83465 | 3/2006 |
| JP | 2006 247740 | 9/2006 |

OTHER PUBLICATIONS

U.S. Appl. No. 11/916,730, filed Dec. 6, 2007, Aruga, et al.
U.S. Appl. No. 11/994,136, filed Dec. 28, 2007, Aruga, et al.
U.S. Appl. No. 12/297,060, filed Oct. 14, 2008, Aruga, et al.
U.S. Appl. No. 12/254,345, filed Oct. 20, 2008, Takagi, et al.
U.S. Appl. No. 12/374,154, filed Jan. 16, 2009, Aruga, et al.
U.S. Appl. No. 12/672,092, filed Feb. 4, 2010, Aruga, et al.
U.S. Appl. No. 12/363,974, filed Feb. 2, 2009, Miwa, et al.
U.S. Appl. No. 12/811,339, filed Jun. 30, 2010, Aruga.

* cited by examiner

*Primary Examiner* — Minh-Loan T Tran
*Assistant Examiner* — Teresa M Arroyo
(74) *Attorney, Agent, or Firm* — Oblon, Spivak, McClelland, Maier & Neustadt, L.L.P.

(57) ABSTRACT

A Cu—Fe—P alloy sheet that is provided with the high strength and with the improved resistance of peel off of oxidation film, in order to deal with problems such as package cracks and peeling, is provided. A copper alloy sheet for electric and electronic parts according to the present invention is a copper alloy sheet containing Fe: 0.01 to 0.50 mass % and P: 0.01 to 0.15 mass %, respectively, with the remainder of Cu and inevitable impurities. A centerline average roughness Ra is 0.2 μm or less and a maximum height Rmax is 1.5 μm or less, and Kurtosis (degree peakedness) Rku of roughness curve is 5.0 or less, in measurement of the surface roughness of the copper alloy sheet in accordance with JIS B0601.

14 Claims, 2 Drawing Sheets

Rku > 5.0

Rku ≤ 5.0

PROBABILITY DENSITY

COPPER ALLOY SHEET FOR ELECTRIC AND ELECTRONIC PARTS

TECHNICAL FIELD

The present invention relates to: (1) a Cu—Fe—P alloy sheet with high strength and with improved resistance of peel off of oxidation film in order to deal with problems such as package cracks and peeling; (2) a Cu—Fe—P alloy sheet with high strength and excellent bendability; (3) a Cu—Fe—P alloy sheet with high strength and excellent stampability in a stamping process; and (4) a Cu—Fe—P alloy sheet with high strength and excellent platability. The copper alloy sheet according to the present invention is suitable as a material used in lead frames for semiconductor devices, and also suitably used in electric and electronic parts other than the lead frames for semiconductor devices, such as other semiconductor parts, material used in electric and electronic parts such as printed wiring boards or the like, switching parts, and mechanical parts such as bus bars, terminals, and connectors. However, the following description will be made centering on the case where a copper alloy sheet is used in a lead frame, a semiconductor part, as a typical application example.

BACKGROUND ART

Conventionally, Cu—Fe—P alloy containing Fe and P are generally used as a copper alloy for semiconductor lead frames. Examples of these Cu—Fe—P alloys include, for example, a copper alloy (C19210 alloy) containing Fe: 0.05 to 0.15% and P: 0.025 to 0.040%; and a copper alloy (CDA194 alloy) containing Fe: 2.1 to 2.6%, P: 0.015 to 0.15%, and Zn: 0.05 to 0.20%. When an intermetallic compound such as Fe or Fe—P is precipitated in a copper matrix, these Cu—Fe—P alloys exhibit high strength, high electric conductivity, and high thermal conductivity among copper alloys, and therefore these alloys have been used as the international standard alloys.

The recent advancement of the large-capacity, miniaturization, and high-performance of semiconductor devices used in electronic apparatuses has urged the growing reduction in the cross-sectional area of lead frames adopted in the semiconductor devices; thereby, there is a demand for higher strength, higher electric conductivity, and higher thermal conductivity. With the demand, there is also a demand for higher strength and higher thermal conductivity to a copper alloy sheet used in lead frames for the semiconductor devices.

On the other hand, plastic packages of semiconductor devices have an advantage that the package in which a semiconductor chip is sealed by a thermosetting resin is excellent in economical efficiency and mass productivity, and therefore they become mainstream. These packages are increasingly thinner with the recent demand for miniaturization of electronic parts.

In assembling the packages, a semiconductor chip is heated to be adhered to a lead frame by using an Ag paste, etc., or soldered or brazed with Ag via a plated layer made of Au and Ag or the like. Thereafter, the package is generally encapsulated with a resin and subsequently connected to an outer lead by electroplating.

The most serious challenge with respect to the reliability of these packages is a package crack or peeling occurring upon implementation. Peeling of a package occurs due to a thermal stress generated in the subsequent heat treatment, when the adhesion between the resin and the die pad (portion where a semiconductor chip of a lead frame is mounted) is deteriorated after assembling the semiconductor package.

On the other hand, a package crack occurs through the following processes: a mold resin absorbs moisture from the air after assembling a semiconductor package, and the moisture vaporizes during a heating process in the subsequent implementation; and when a crack is present inside the package at the time, the moisture is applied to the peeling plane, which acts as an internal pressure; and a swelling is then caused in the package by the inner pressure, or a crack is caused when the resin is weak against the inner pressure. When a crack is caused in a package after the implementation, moistures and impurities are incursive therein to cause the chip to be corroded, impairing the function as a semiconductor. In addition, the swelling of a package results in poor appearance and lost of its commodity value. In recent years, such problems involving package cracks and peeling have been remarkable with the above advancement of thinning of the packages.

The problems involving package cracks and peeling are caused by the deteriorated adhesion between the resin and the die pad. An oxidation film of a lead frame base material has the greatest influence on the adhesion between the resin and the die pad. The lead frame base material has been subjected to various heating processes for producing sheets or lead frames. Accordingly, an oxidation film with a thickness of tens to hundreds of nanometers is formed on the surface of the base material before a plating process is performed with Ag or the like. On the surface of the die pad, a copper alloy and the resin are in contact with each other via the oxidation film, and hence the peeling of the oxidation film from the lead frame base material directly leads to the peeling between the resin and the die pad, causing adhesion between the resin and the lead frame base material to be remarkably deteriorated.

Accordingly, the problem involving the package crack and the peeling depends on the adhesion between the oxidation film and the lead frame base material. Therefore, the above Cu—Fe—P alloy sheet with high strength is required as a lead frame base material to have a high adhesion property with the oxidation film formed on its surface through various heating processes.

In addition, heating temperatures in the above various heating processes for producing copper alloy sheets and lead frames, are increasingly higher for the purposes of improving productivity and efficiency. For example, in the lead frame production process, a heat treatment after a press process, etc., is required to be conducted at a higher temperature and in a shorter time. With such a heating temperature being higher, a new problem arises that the oxidation film formed on a lead frame base material tends to peel off from the material more easily due to roughness and fineness of the film, as compared to a previous oxidation film that is formed by heating at a lower temperature.

Techniques for improving resistance of peel off of oxidation film have been conventionally proposed, although the number of the proposals is small. For example, it is proposed that crystalline orientation in the surface layer of a copper alloy is controlled in Patent Document 1. That is, Patent Document 1 proposes that, in crystalline orientation in the surface of a copper alloy base material for lead frames, which is evaluated by the thin film method using an XRD, resistance of peel off of oxidation film can be improved by a ratio of the peak intensity of {100} to the peak intensity of {111} being 0.04 or less. It is noted that Patent Document 1 includes every kind of copper alloy base materials for lead frames; however, Cu—Fe—P alloys substantially exemplified are only Cu—Fe—P alloys with an Fe content of 2.4% or more, which is a large content.

Taking the surface roughness of a Cu—Fe—P alloy sheet into consideration, Patent Documents 2 and 3 propose that resistance of peel off of oxidation film of the sheet can be improved by making a centerline average roughness Ra 0.2 µm or less and a maximum height Rmax 1.5 µm or less, in measurements of the surface roughness. More specifically, in Patent Documents 2 and 3, the surface roughness is controlled by the type (surface roughness) of a rolling roll in the cold-rolling.

Also in recent years, with increasing applications of Cu—Fe—P alloys and the advancement of the lightweight, thinning, and miniaturization of electric and electronic apparatuses, these copper alloys are also required to have higher strength, higher electric conductivity, and excellent bendability. As for such bendability, the copper alloys are required to endure sharp bending such as U-bending or 90° bending after notching.

On the other hand, it is conventionally known that bendability can be improved to some extent by grain refining or by controlling the dispersion state of dispersoids/precipitates (see Patent Documents 4 and 5).

In Cu—Fe—P alloys, it is also proposed that the microstructure thereof is controlled in order to improve properties such as bendability. More specifically, it is proposed that: a ratio, I(200)/I(220), of the intensity, I(200), of x-ray diffraction of (200) to the intensity, I(220), of x-ray diffraction of (220) is 0.5 or more and 10 or less; or orientation density: D (Cube orientation) of Cube orientation is 1 or more and 50 or less; or a ratio: D (Cube orientation)/D(S orientation) of the orientation density of Cube orientation to the orientation density of S orientation, is 0.1 or more and 5 or less (see Patent Document 6).

It is also proposed that a ratio, [I(200)+I(311)/I(220)], of a total of the intensity, I(200), of x-ray diffraction of (200) and the intensity, I(311), of x-ray diffraction of (311) to the intensity, I(220), of x-ray diffraction of (220) is 0.4 or more (see Patent Document 7).

On the other hand, the copper alloy sheets provided with high strength are also required to have workability so as to be formed into the lead frames with reduced cross-sectional areas. Specifically, a copper alloy sheets are subjected to a stamping process so as to be formed into lead frames, and hence the copper alloy sheets are required to have excellent stampability. The demand also exists in the applications in which the copper alloy sheets are stamped, other than the application of lead frames.

Conventionally, in order to improve the stampability of Cu—Fe—P alloy sheets, techniques for controlling chemical components in which trace additives such as Pb and Ca are added or a compound that is a starting point of a break is dispersed, or techniques in which a grain size, etc., is controlled, have been widely used.

However, these techniques have problems that the controls per se are difficult to be carried out, these controls adversely affect other properties, and therefore a production cost is increased.

On the other hand, it is proposed that the stampability and the bendability of a Cu—Fe—P alloy sheet are improved taking the structure thereof into consideration. For example, Patent Document 8 discloses a Cu—Fe—P alloy sheet containing Fe: 0.005 to 0.5 wt %, P: 0.005 to 0.2 wt %, and further either or both of Zn: 0.01 to 10 wt % and/or Sn: 0.01 to 5 wt % if needed, with the remainder of Cu and inevitable impurities. In Patent Document 8, the stampability is improved by controlling an integration degree of crystal orientations of the copper alloy sheet (see Patent Document 8).

More specifically, in Patent Document 8, the integration degree is controlled with the use of the fact that: as the copper alloy sheet is recrystallized and a grain size of the structure becomes larger, an integration ratio of {200} plane and {311} plane on the sheet surface is larger; and when the copper alloy sheet is rolled, an integration ratio of {220} plane is larger. Characteristically, Patent Document 8 is intended to improve the stampability by increasing an integration ratio of {220} plane on the sheet surface relative to {220} plane and {311} plane. More specifically, assuming that, on the sheet surface, an intensity of x-ray diffraction of {200} plane is I[200], that of {311} plane is I[311], and that of {220} plane is I[220], [I[200]+I[311]]/I[220]<0.4 should be satisfied.

The afore-mentioned Patent Documents 6 and 7 also disclose copper alloy sheets of which stampability is improved. (see Patent Documents 6 and 7).

Patent Document 9 proposes that I(200)/I(110) should be 1.5 or less in order to improve the flexibility of a Cu—Fe—P alloy sheet (see Patent Document 9).

In addition, it is known that, in order to improve the bendability of a Cu—Ni—S alloy (Corson alloy), a ratio of the uniform elongation to the total elongation, which are among the tensile properties of the copper alloy, is made 0.5 or more, although the copper alloy belongs to another copper alloy system (see Patent Document 10).

A copper alloy sheet provided with such high strength is subjected to a stamping process and a bending process or the like, followed by being plated with Ag, etc., and is then formed into lead frames.

However, there sometimes occurs unusual precipitation of the plating partially (locally) on the surface of the Ag plating or the like, the unusual precipitation being observed by a microscope as a projection of the plated layer, like a dot illustrated by the arrow in FIG. 3 (SEM picture substituting for a drawing, magnification 500). When such unusual precipitation of the plating occurs, the lead frame is no longer used as a semiconductor lead frame because a bonding defect is induced.

The unusual precipitation of the plating does not occur on the whole surface of the plating, nor in a large amount in every semiconductor lead frame to be produced. However, for a highly-efficient mass production line of semiconductor lead frames, when the unusual precipitation of the plating occurs in semiconductor lead frames to be produced, even if the number of the occurrences is very small, i.e., in ppm order, there is inevitably a serious influence on the production speed and the production efficiency of the line.

At present, the unusual precipitation of the plating is presumed to be caused by the residue of the coarse inclusions (oxides and dispersoids) that are formed in the casting and melting process onto the surfaces of a final product, or by the surface defects such as coarse pore, which are formed due to hydrogen. It is because, on the surface of a final product immediately beneath the plating layer where the unusual precipitation of the plating occurs, coarse inclusions (oxides and dispersoids) or surface defects such as coarse pores formed due to hydrogen, are mostly present and remain.

It is inevitable that a Cu—Fe—P alloy contains hydrogen and oxygen to some extent during the casing and melting process, and coarse inclusions (oxides and dispersoids) formed in the casting and melting process remain up to a final product sheet and pores formed due to hydrogen appear as surface defects.

Many techniques in which a copper alloy for semiconductor lead frames is provided with high strength and high formability such as stampability and bendability, have conventionally been proposed. However, techniques in which the platability of a copper alloy for semiconductor lead frames, in particular, the platability of a Cu—Fe—P alloy is improved, and more particularly, the afore-mentioned unusual precipitation of the plating is suppressed, have not been proposed so many.

Among them, a technique in which the platability of a copper alloy sheet is improved by containing Fe: 1.5 to 2.3 wt % or P: 0.015 to 0.045 wt %, which are relatively large amounts, is proposed (Patent Document 11). In Patent Document 11, it is also proposed that intercrystalline cracks are prevented by containing C: 10 to 100 ppm, which is also a relatively large amount.

[Patent Document 1] Japanese Patent Laid-Open No. 2001-244400
[Patent Document 2] Japanese Patent Laid-Open No. H2-122035
[Patent Document 3] Japanese Patent Laid-Open No. H2-145734
[Patent Document 4] Japanese Patent Laid-Open No. H6-235035
[Patent Document 5] Japanese Patent Laid-Open No. 2001-279347
[Patent Document 6] Japanese Patent Laid-Open No. 2002-339028
[Patent Document 7] Japanese Patent Laid-Open No. 2000-328157
[Patent Document 8] Japanese Patent Laid-Open No. 2000-328158
[Patent Document 9] Japanese Patent Laid-Open No. 2006-63431
[Patent Document 10] Japanese Patent Laid-Open No. 2002-266042
[Patent Document 11] Japanese Patent No. JP 2962139

DISCLOSURE OF THE INVENTION

Problems to be Solved by the Invention

However, these conventional techniques are insufficient to ensure such a high level of the resistance of peel off of oxidation film as the present invention is intended. That is, a new problem that the oxidation film on the surface of a lead frame base material formed by heating at a high temperature, tends to peel off easily from the material, cannot be solved as a whole by the techniques.

At first, a substantial Fe content of a Cu—Fe—P alloy in Patent Document 1 is large exceeding 2.4 mass % at lowest, as stated above. In this point, the technique in Patent Document 1 could be indeed effective for improving resistance of peel off of oxidation film of a Cu—Fe—P alloy with a large Fe content. In fact, the resistance of peel off of oxidation film of a Cu—Fe—P alloy with an Fe content of 2.41% in Example 1 of Patent Document 1, is improved up to 633K (360° C.) at the critical peeling temperature of the oxidation film.

However, when an Fe content is large exceeding 2.4 mass %, an oxidation film on the surface of a lead frame base material formed by heating at a high temperature, tends to peel off more easily from the material. In addition, another problem that not only the material properties such as electric conductivity but also the productivity such as castability are remarkably decreased, arises.

When intending, for example, to increase a precipitation amount of the above precipitated particles in order to increase electric conductivity forcedly, it causes a problem that the precipitated particles are developed and coarse, resulting in decreased strength and decreased softening resistance. In other words, by the technique in Patent Document 1, the high strength cannot be compatible with the resistance of peel off of oxidation film, which are both required of a Cu—Fe—P alloy.

Accordingly, when applying the technique in Patent Document 1 directly to a Cu—Fe—P alloy that is provided with high strength by a composition in which an Fe content is substantially reduced to 0.5% or less, the above resistance of peel off of oxidation film that is requested of a lead frame or the like, cannot be obtained.

In the case where the above centerline average roughness Ra is 0.2 µm or less, and the maximum height Rmax is 1.5 µm or less, as with Patent Documents 2 and 3, resistance of peel off of oxidation film is indeed increased, as compared to a Cu—Fe—P alloy sheet of which surface roughness is more coarse.

However, the present inventors have found that, with respect to the resistance of peel off of oxidation film of an oxidation film that is formed by heating at a higher temperature, which is an object of the present invention, there is unexpectedly a significant difference in the resistance of peel off of oxidation film as stated later, even in the case where the centerline average roughness Ra is equally 0.2 µm or less, and the maximum height Rmax is equally 1.5 µm or less.

This means that an element (factor) other than the centerline average roughness Ra and the maximum height Rmax, is significantly involved. And, this means that resistance of peel off of oxidation film of an oxidation film that is formed by heating at a higher temperature, which is an object of the present invention, cannot be improved unless the element (factor) is controlled.

Addition of solid solution strengthening elements such as Sn and Mg, and increase in an amount of the work-hardening by the heavy-working with an increase in a working ratio in the cold-rolling, which are conventional techniques for providing high strength to copper alloys, inevitably entail deterioration of bendability; hence, it is difficult that the required strength is compatible with the required bendability. However, in order to obtain a Cu—Fe—P alloy having high strength of which tensile strength is 500 MPa or more, which can be adopted in electric and electronic parts of the recent light, thin, short, and compact in size ages, such an increase in an amount of the work-hardening by the heavy-working in the cold-rolling is essential.

In such a Cu—Fe—P alloy with high strength, the bendability cannot be improved sufficiently for the afore-mentioned sharp bending such as U-bending or 90° bending after notching, only by controlling the structure of the alloy, such as grain refining or controlling the dispersion state of dispersoids/precipitates, as described in the above Patent Documents 4 and 5 or the like, and further only by controlling the microstructure thereof, as described in the above Patent Documents 6 and 7 or the like.

The techniques in the Patent Documents 6 or 8 improve stampability by increasing an integration ratio of {220} plane or {200} plane on the sheet surface. The stampability of a Cu—Fe—P alloy sheet is indeed improved by increasing an integration ratio of these certain planes.

However, the reduction in the cross-sectional areas of lead frames has been increasingly advancing, which entails increasing advancements of narrowing a lead width (from 0.5 mm to 0.3 mm) and thinning a sheet thickness (from 0.25 mm to 0.15 mm); hence there is an increasingly strict demand for the stampability at a stamping process to a Cu—Fe—P alloy sheet with high strength. Accordingly, the effect of improving the stampability by controlling an integration ratio of the structure as described in the above Patent Documents 6 and 8, is insufficient for satisfying the requested stampability.

And also, the technique for improving bendability of a copper alloy sheet as disclosed in the above Patent Document 10, cannot improve the requested stampability. Patent Document 10 handles a Cu—Ni—Si alloy (Corson alloy) of which 0.2 proof stress is at 800 MPa level and of which electric conductivity is at 40% IACS level, which is completely different from a Cu—Fe—P alloy of the present invention in their alloy systems and properties. The bendability and the stampability are completely different properties from each other in their mechanisms, and in the case where a ratio of the uniform elongation to the total elongation is 0.5 or more as with Patent Document 10, the stampability of a Cu—Fe—P alloy of the present invention is deteriorated, as stated later.

In the case where Fe and P are contained in relatively large amounts as is in patent Document 11, an amount of the coarse inclusions (oxides and dispersoids) that are formed in the casting and melting process is large, and the inclusions remain in a large amount onto the surface of a final product, and therefore the above unusual precipitation of the plating are adversely induced.

In addition, the technique in Patent Document 11 does not take surface defects such as pores formed due to hydrogen into consideration, which are a cause of the unusual precipitation of the plating; therefore, the unusual precipitation of the plating due to the defects cannot be prevented.

In addition, the technique in Patent Document 11 is intended to contain C in a large amount of 10 to 100 ppm by adding an Fe—C base alloy in a melt stream, in a copper sheet production process. However, C is easy to disperse, and thereby disperses at the moment of being added in a melt; hence, it is usually very difficult to contain C in an amount of 10 ppm or more in a melt. In addition, the present inventors have found that, in a Cu—Fe—P alloy with a large C content, the unusual precipitation of the plating is adversely promoted, as stated later.

Accordingly, the techniques effective for preventing the afore-mentioned unusual precipitation of the plating have not been proposed so much, so far. Therefore, in order to prevent the above unusual precipitation of the plating in the sheets including Cu—Fe—P alloys, contents of hydrogen and oxygen or the like, which causes the unusual precipitation of the plating, are generally to be reduced more actively in the casting and melting process.

However, it becomes a major factor for raising a production cost or for decreasing a production efficiency of a copper alloy production process that contents of hydrogen and oxygen or the like are reduced more actively to extremely small amounts in the copper alloy production process, in particular, in the casting and melting process, etc. Accordingly, it is inevitable that a Cu—Fe—P alloy contains hydrogen and oxygen to some extent in the casting and melting process.

Accordingly, it is also inevitable that, in a Cu—Fe—P alloy, coarse inclusions (oxides and dispersoids) formed in the casting and melting process remain up to a final product sheet, and a pore formed due to hydrogen appears as a surface defect.

Accordingly, a Cu—Fe—P alloy sheet is needed in which the afore-mentioned unusual precipitation of the plating can be prevented, even when hydrogen and oxygen are contained to some extent in the casting and melting process.

The present invention has been made in order to solve these problems, and an object of the invention is to provide a Cu—Fe—P alloy sheet in which high strength is compatible with excellent resistance of peel off of oxidation film of an oxidation film formed by heating at a higher temperature. Another object of the present invention is to provide a Cu—Fe—P alloy sheet in which high strength is compatible with excellent bendability. Another object of the present invention is to provide a Cu—Fe—P alloy sheet in which high strength is compatible with excellent stampability. Moreover, another object of the present invention is to provide a Cu—Fe—P alloy sheet in which high strength is compatible with excellent platability for preventing unusual precipitation of the plating.

Means for Solving the Problems

In order to attain the afore-mentioned objects, the gist of a copper alloy sheet for electric and electronic parts according to the present invention, is a copper alloy sheet containing Fe: 0.01 to 0.50 mass % and P: 0.01 to 0.15 mass %, respectively, with the remainder of Cu and inevitable impurities, wherein a centerline average roughness Ra is 0.2 μm or less and a maximum height Rmax is 1.5 μm or less, and Kurtosis (degree of peakedness) Rku of roughness curve is 5.0 or less, in measurement of the surface roughness of the copper alloy sheet in accordance with JIS B0601.

In the copper alloy sheet for electric and electronic parts according to the present invention, r value parallel to the rolling direction of the copper alloy sheet is preferably 0.3 or more.

In the copper alloy sheet for electric and electronic parts according to the present invention, the tensile modulus thereof is preferably more than 120 GPa, and a ratio of the uniform elongation to the total elongation is preferably less than 0.50, wherein the two measurements are determined by a tensile test using a test piece taken the width direction of the alloy sheet, which is perpendicular to the rolling direction of the sheet, as the longitudinal direction of the test piece.

The copper alloy sheet for electric and electronic parts according to the present invention preferably further contains C: 3 to 15 ppm, and contents of O and H are preferably regulated so as to be 40 ppm or less and 1.0 ppm or less, respectively.

The copper alloy sheet according to the present invention may further contain Sn: 0.005 to 5.0 mass % in order to attain high strength, or further contain Zn: 0.005 to 3.0 mass % in order to improve softening resistance of peel off of the soldering and the Sn plating, respectively.

In the copper alloy sheet according to the present invention, both contents of S and Pb are preferably further regulated so as to be 20 ppm or less, respectively.

In the copper alloy sheet according to the present invention, tensile strength thereof is preferably 500 MPa or more, and hardness thereof is preferably 150 Hv or more.

The copper alloy sheet according to the present invention may further contain a total content of 0.0001 to 1.0 mass % of one or more elements selected from Mn, Mg, and Ca.

The copper alloy sheet according to the present invention may further contain a total content of 0.001 to 1.0 mass % of one or more elements selected from Zr, Ag, Cr, Cd, Be, Ti, Co, Ni, Au, and Pt.

The copper alloy sheet according to the present invention may further contain a total content of 0.0001 to 1.0 mass % of one or more elements selected from Mn, Mg, and Ca; and contain a total content of 0.001 to 1.0 mass % of one or more elements selected from Zr, Ag, Cr, Cd, Be, Ti, Co, Ni, Au, and Pt, respectively, wherein a total content of these contained elements is 1.0 mass % or less.

The copper alloy sheet according to the present invention preferably further contains a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

Also, in order to attain the afore-mentioned objects, the gist of the copper alloy sheet for electric and electronic parts according to the present invention, is a copper alloy sheet containing Fe: 0.01 to 0.50 mass % and P: 0.01 to 0.15 mass %, respectively, with the remainder of Cu and inevitable impurities, wherein tensile strength thereof is 500 MPa or more and the hardness thereof is 150 Hv or more, and r value parallel to the rolling direction of the copper alloy sheet is 0.3 or more.

Also, in order to attain the afore-mentioned objects, the gist of the copper alloy sheet for electric and electronic parts according to the present invention, is a copper alloy sheet containing Fe: 0.01 to 0.50 mass % and P: 0.01 to 0.15 mass %, respectively, with the remainder of Cu and inevitable impurities, wherein tensile strength thereof is more than 120 GPa and a ratio of the uniform elongation to the total elongation is less than 0.50, the two measurements being determined by a tensile test using a test piece taken the width direction of the alloy sheet, which is perpendicular to the rolling direction of the sheet, as the longitudinal direction of the test piece.

Also, in order to attain the afore-mentioned objects, the gist of the copper alloy sheet for electric and electronic parts according to the present invention, is a copper alloy sheet containing Fe: 0.01 to 0.50 mass %, P: 0.01 to 0.15 mass %, and C: 3 to 15 ppm, respectively, wherein contents of O and H are regulated so as to be 40 ppm or less and 1.0 ppm or less, respectively.

The copper alloy sheet according to the present invention can be used in various electric and electronic parts, in particular, preferably used in the application of the semiconductor lead frames, semiconductor parts.

Effects of the Invention

The copper alloy sheet according to the present invention has tensile strength of 500 MPa or more and hardness of 150 Hv or more, as a guideline of the high strength. It is noted that electric conductivity in a copper alloy sheet is correlated with strength of the sheet, and in the present invention, electric conductivity is also inevitably lower as the sheet has higher strength; however, there is no trouble in practical application. Accordingly, the high electric conductivity mentioned herein means that the sheet has relatively high electric conductivity for high strength.

In the present invention, resistance of peel off of oxidation film is improved by controlling Kurtosis (degree of peakedness) Rku of roughness curve of a Cu—Fe—P alloy sheet with high strength and with an oxidation film formed by heating at a higher temperature.

As shown by the equation described later, Kurtosis (degree of peakedness) Rku of roughness curve is defined in the measurement of surface roughness JIS B 0601 and is known, which indicates the peakedness of the concavities and convexities of surface roughness (curve of a rolling circle waviness profile Z(x)).

For example, as illustrated in FIG. 1(a), when Rku is large exceeding 5.0, the concave-convex curve of surface roughness (curve of a rolling circle waviness profile Z(x)) is sharp, or precipitous. On the other hand, as illustrated in FIG. 1(b), when Rku is small, that is, 5.0 or less, as is in the present invention, the concave-convex curve of surface roughness (curve of a rolling circle waviness profile Z(x)) is relatively rounded, or smooth.

According to the knowledge of the present inventors, resistance of peel off of oxidation film of an oxidation film of a Cu—Fe—P alloy sheet that is formed by heating at a higher temperature, can be more improved when the concave-convex curve of surface roughness (curve of a rolling circle waviness profile Z(x)) is relatively rounded, or smooth.

Herein, it is thought that resistance of peel off of oxidation film is likely to be more improved when the concave-convex curve of surface roughness is sharp, or precipitous, with Rku exceeding 5.0 as is in FIG. 1(a), because an anchor effect is more demonstrated in the case. With respect to this point, it is presently still unknown why resistance of peel off of oxidation film of an oxidation film of a Cu—Fe—P alloy sheet that is formed by heating at a higher temperature, is more improved when the concave-convex curve of surface roughness is relatively rounded, or smooth, as illustrated in FIG. 1(b).

In the present invention, however, resistance of peel off of oxidation film of an oxidation film of a Cu—Fe—P alloy sheet that is formed by heating at a higher temperature, can be more improved by the simple measures to control Kurtosis (degree of peakedness) Rku of roughness curve of a copper alloy sheet with a Cu—Fe—P system composition, without using a conventional technique in which a large content of Fe causes another problem.

In the present invention, Kurtosis (degree of peakedness) Rku of roughness curve of a copper alloy sheet is a technical element that is independent from the centerline average roughness Ra and the maximum height Rmax. That is, as described in the afore-mentioned Patent Documents 2 and 3, even in the case where the surface of a copper alloy sheet is smoothed by a centerline average roughness Ra being 0.2 μm or less and a maximum height Rmax being 1.5 μm or less, there are cases where Rku exceeds 5.0 and where Rku is 5.0 or less.

In other words, even when the surface of a copper alloy sheet is smoothed by making a centerline average roughness Ra 0.2 μm or less and a maximum height Rmax 1.5 μm or less, Rku is not inevitably 5.0 or less, and there is a high probability that Rku is out of the range or larger than that. Accordingly, even when a centerline average roughness Ra is 0.2 μm or less and a maximum height Rmax is 1.5 μm or less, it is quite unknown whether Rku of the surface of the copper alloy sheet is 5.0 or less, unless Rku is actually measured.

This fact is supported by the fact that there is a significant difference in resistance of peel off of oxidation film of an oxidation film of a Cu—Fe—P alloy that is formed by heating at a higher temperature, in accordance with Kurtosis (degree of peakedness) Rku of roughness curve, even when a centerline average roughness Ra and a maximum height Rmax are the same, as stated later. This fact is also supported by the fact that Rku cannot be controlled so as to be 5.0 or less by the physical processing such as conventional control of the surface roughness of a rolling roll, as described in Patent Documents 2 and 3, but can be controlled by a cleaning treatment entailing chemical etching, as stated later.

According to the present invention, bendability of a Cu—Fe—P alloy sheet can be improved by making r value parallel to the rolling direction of the sheet a constant value that is 0.3 or more, even for a copper alloy sheet with high strength of which tensile strength is 500 MPa or more.

Herein, it is known that, in the fields of steel sheets and aluminum alloy sheets other than copper sheets, bendability thereof is improved by increasing r value thereof, even for a steel sheet or an aluminum sheet with high strength. However, it is not necessarily known that, in copper alloys, in particular, a Cu—Fe—P alloy sheet, bendability thereof is improved taking r value thereof into consideration.

The reason is presumed to be as follows: as stated with respect to the conventional techniques, in the field of Cu—Fe—P alloy sheets, it has been mainstream that bendability of the sheets is improved by grain refining, or by controlling crystal orientation distribution density of the copper alloy sheet, such as controlling the dispersion state of dispersoids/precipitates and controlling the microstructure thereof. The reason is also presumed to be as follows: there is a common knowledge that, in a Cu—Fe—P alloy sheet, a factor other than r value has a significant influence on improving bendability, and r value is not so effective for improving bendability.

As stated above, in a Cu—Fe—P alloy sheet in which contents of solid solution strengthening elements are strictly limited, unlike other Corson alloys, an amount of the work-hardening by the heavy-working with an increase in a working ratio in the cold-rolling should be carried out in order to provide high strength to a Cu—Fe—P alloy sheet.

In the heavy-working in the cold-rolling, a copper alloy sheet naturally has significant anisotropy of crystal orientation in which grain size is significantly elongated in the rolling direction. Therefore, it is known that bendability, in particular, parallel to the rolling direction, is remarkably deteriorated. Accordingly, it naturally becomes a major concern among persons skilled in the art that the significant anisotropy of the crystal orientation, that is, the crystal orientation distribution density of the copper alloy sheet is to be controlled in order to improve bendability.

However, in such control of the crystal orientation distribution density of a copper alloy sheet, it is very difficult to control each crystal orientation so as to have a desired distribution density in order to obtain the desired bendability, that is, to actually produce such a copper alloy sheet.

On the other hand, the present invention improves bendability of a Cu—Fe—P alloy sheet by increasing r value of the sheet, even for a copper alloy sheet with high strength. The r value is also referred to as a plastic strain ratio, indicating a reduction ratio of a sheet thickness to a sheet width in a tensile test of a material such as a Cu—Fe—P alloy sheet. As a reduction ratio of a sheet thickness to a sheet width of a material is smaller, r value is larger. With respect to the point, bendability is also better as a reduction ratio of a sheet thickness to a sheet width is smaller; hence, as r value is larger, a material such as a Cu—Fe—P alloy sheet, is more difficult to break and bendability thereof is more improved.

Such correlation or consequence between bendability and r value is also supported by the fact that r value is an index indicating the plastic anisotropy, as already known, and has a close relation with the above crystal orientation distribution density.

However, even if there is a correlation between bendability and r value in a Cu—Fe—P alloy sheet, it is a completely different issue whether the r value has an effect of actually improving bendability, as stated above. And, it is also a completely different issue whether the r value can be improved to the extent where bendability is improved. That is, in a Cu—Fe—P alloy sheet, it is an unknown issue whether bendability thereof can be improved by increasing r value, unless actually performed.

With respect to the point, in the present invention, r value parallel to the rolling direction of a Cu—Fe—P alloy sheet is made larger or equal to a constant that is 0.3 or more, by a specific technique (measures) in which the low-temperature annealing after the cold-rolling is performed by continuous annealing, and at the time, an appropriate tension is applied to a passing sheet, as stated later. Thereby, bendability of the sheet can be improved, even for a copper alloy sheet with high strength of which tensile strength is 500 MPa or more.

In the present invention, it has been found that, in a Cu—Fe—P alloy sheet with high strength of which tensile strength is 500 MPa or more, tensile properties such as the tensile modulus and a ratio of the uniform elongation to the total elongation, which are determined by a tensile test, have significant influence on stampability rather than control of the microstructure of the sheet as described in Patent Documents 6 and 8.

As the tensile modulus determined by a tensile test is larger, stampabillity is more improved. Also, as a ratio of the uniform elongation to the total elongation is smaller, stampability is more improved. However, these tensile properties specified by the present invention are presently unknown with respect to a clear correlation with the structure of a Cu—Fe—P alloy sheet, that is, the state of precipitates (amount or size of precipitates), or the microstructure or the like. Accordingly, in the present invention, the structure of a Cu—Fe—P alloy sheet is difficult to be specified qualitatively and quantitatively, as a requirement for improving stampability.

These tensile properties specified by the present invention are naturally affected greatly by a component composition of a Cu—Fe—P alloy sheet, and also affected greatly by the production processes and the production conditions; hence, they cannot be determined only by a component composition. That is, these tensile properties specified by the present invention are greatly affected by the production processes and the production conditions of a Cu—Fe—P alloy sheet such as a homogenization heat treatment or a heating treatment prior to the hot-rolling, temperature at the start of cooling with water after the hot-rolling, temperature of the intermediate annealing, and line speed during the final continuous annealing, as stated later.

These tensile properties specified by the present invention are difficult to be obtained by the batch-type final annealing, that is, difficult to be obtained unless the continuous annealing is performed in which a sheet (coil) continuously passes through a furnace and is processed.

Accordingly, in the present invention, a Cu—Fe—P alloy sheet is specified by the tensile properties such as the tensile modulus and a ratio of the uniform elongation to the total elongation as well as a component composition, in order to ensure the good stampability thereof, as stated above.

The present invention is primarily characterized by containing carbon (C) in an extremely small amount in terms of absolute amount, the content being larger or equal to that of being contained naturally.

In the present invention, the contained carbon serves as suppressing agglomeration of oxygen (O) and hydrogen (H), which are present in a Cu—Fe—P alloy sheet, and as increasing starting points of inclusions and pores. The carbon also serves as making the sizes of the formed inclusions and pores fine, and as preventing that these inclusions and pores become starting points (causes) where the above unusual precipitation of the plating originate. As a result, high strength is compatible with excellent platability by which the unusual precipitation of the plating is prevented, in a Cu—Fe—P alloy sheet.

However, in order to ensure the operation effect of C, higher limits of contents of O and H present in a Cu—Fe—P alloy sheet are specified as a premise as well as a C content.

DESCRIPTION OF SYMBOLS

Figure 1A:
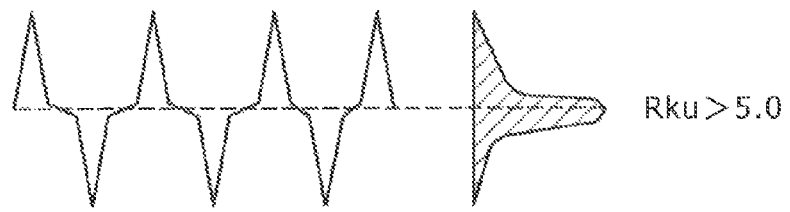
FIG. 1 is an illustrative diagram illustrating Kurtosis (degree of peakedness) Rku of roughness curve in the surface roughness of a copper alloy sheet, which is specified by the present invention.

1: COPPER ALLOY SHEET
2: STAMPED HOLE
3: CUTTING PLACE

BEST MODE FOR CARRYING OUT THE INVENTION

Importance of each requirement for satisfying required properties of a Cu—Fe—P alloy sheet according to the present invention used for semiconductor lead frames or the like, and embodiments of the invention will be described specifically below.

First Embodiment

Cu—Fe—P Alloy Sheet with High Strength and Improved Resistance of Peel Off of Oxidation Film in Order to Deal with Problems of Package Cracks and Peeling (Surface Roughness)

In the present invention, as a prerequisite requirement of the surface roughness of a Cu—Fe—P alloy sheet, a centerline average roughness Ra should be 0.2 μm or less and a maximum height Rmax should be 1.5 μm or less, in measurement of the surface roughness of the copper alloy sheet in accordance with JIS B06061. The centerline average roughness Ra is preferably 0.1 μm or less and the maximum height Rmax is preferably 1.0 μm or less.

When the centerline average roughness Ra exceeds 0.2 μm, or the maximum height Rmax exceeds 1.5 μm, the surface of the Cu—Fe—P alloy sheet is too coarse rather than smooth, impairing the basic properties requested of a lead frame. That is, heating adhesion of a semiconductor chip to a lead frames by using Ag paste, etc., plating process of Au and Ag, etc, or soldering or brazing with Ag, etc., are impaired. Further, it becomes difficult that Rku of the surface of a Cu—Fe—P alloy sheet is controlled so as to be 5.0 or less by a cleaning treatment entailing chemical etching.

(Rku)

In the present invention, Kurtosis (degree of peakedness) Rku of roughness curve in measurement of the surface roughness of a Cu—Fe—P alloy sheet, in accordance with JIS B0601, should be 5.0 or less based on the above prerequisite requirement, in order to improve resistance of peel off of oxidation film of an oxidation film of the sheet that is formed by heating at a higher temperature. When Rku exceeds 5.0, resistance of peel off of oxidation film of an oxidation film of a Cu—Fe—P alloy sheet that is formed by heating at a higher temperature, cannot be improved. Rku is preferably 4.5 or less.

In JIS B0606, Kurtosis (degree of peakedness) Rku of roughness curve is defined as follows, as represented by the following equation: a fourth-power average of a curve of a rolling circle waviness profile Z(x) with respect to the reference length lr on the surface of an item to be measured, is divided by a fourth-power of the root mean square Rq.

$$Rku = \frac{1}{Rq^4}\left(\frac{1}{lr}\int_0^{lr} Z^4(x)\,dx\right)$$ [Equation 1]

As illustrated in FIG. 1, the Rku represents a characteristic average parameter in the height direction of a concave-convex curve of the surface roughness (curve of a rolling circle waviness profile Z (x)).

The characteristic in the height direction is represented by a degree of peakedness; and when Rku is large exceeding 5.0, a concave-convex curve of the surface roughness (curve of a rolling circle waviness profile Z (x)) is sharp, or precipitous, as illustrated in FIG. 1(a). On the other hand, when Rku is small, that is, 0.5 or less, as is in the present invention, a concave-convex curve of the surface roughness is relatively rounded, or smooth, as illustrated in FIG. 1(b).

Figure 1B:
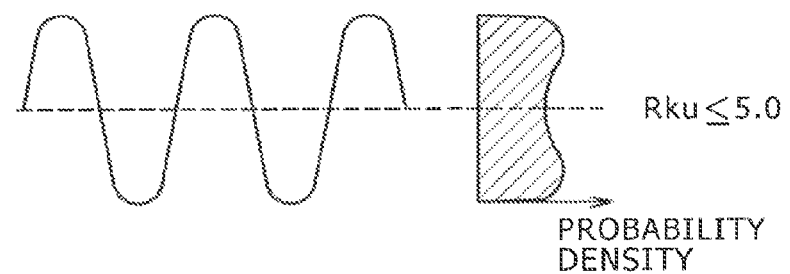

On the other hand, the above centerline average roughness Ra is, when mentioned with respect to the concave-convex curve of the surface roughness in FIGS. 1(a) and 1(b), an average parameter of amplitude heights in the height direction, and the above maximum height Rmax is a parameter of the maximum height of amplitudes in the height direction, both of which are widely used as indexes of the surface roughness. Accordingly, it can be understood that Rku of the present invention is an independent value that is never associated with the centerline average roughness Ra and the maximum height Rmax, and as illustrated in FIGS. 1(a) and 1(b), Rkus are greatly different even if Ras and Rmaxs are the same.

In JIS B0601, as what indicate the characteristic average parameters in the height direction, there are Pku: Kurtosis (degree of peakedness) of profile curve and Wku: Kurtosis (degree peakedness) of waviness curve, etc., other than Rku. However, these Pku and Wku are less correlative with the resistance of peel off of oxidation film of an oxidation film of a Cu—Fe—P alloy sheet that is formed by heating at a higher temperature, than Rku of the present invention. Accordingly, in the present invention, Rku is selected to be specified by the present invention, among the characteristic average parameters in the height direction of the surface roughness (curve).

In the present invention, the surface of a Cu—Fe—P alloy sheet is at first controlled by the physical processing such as control of the surface roughness of a rolling roll, such that a centerline average roughness Ra is 0.2 μm or less and a maximum height Rmax is 1.5 μm or less. Subsequently, Rku is made 5.0 or less by a cleaning treatment entailing chemical etching, as stated later.

(r Value)

In the present invention, r value parallel to the rolling direction of a copper alloy sheet is preferably 0.3 or more. With the r value being 0.3 or more in this way, a copper alloy sheet that is further provided with excellent bendability in addition to the above properties, can be obtained. A method for measuring r value or the like will be described later.

(Tensile Module, Uniform Elongation/Total Elongation)

In the present invention, the tensile modulus thereof is preferably more than 120 GPa, and a ratio of the uniform elongation to the total elongation is preferably less than 0.50, wherein the two measurements are determined by a tensile test using a test piece taken the width direction of the alloy sheet, which is perpendicular to the rolling direction of the sheet, as the longitudinal direction of the test piece. By further provided with these features, a copper alloy sheet that is further provided with excellent stampability in addition to the above properties, can be obtained. The tensile modulus and the uniform elongation/the total elongation will be described in detail later.

(Component Composition of Copper Alloy Sheet)

In the present invention, a copper alloy sheet preferably has basic properties as a material used for semiconductor lead frames or the like, such as the high strength of which tensile strength is 500 MPa or more, and the hardness of 150 Hv or more or the like. The copper alloy sheet according to the present invention has excellent platability by which the unusual precipitation of the plating are prevented, in addition to satisfying these basic properties, or on the premise that these basic properties are not deteriorated. For this purpose, the Cu—Fe—P alloy sheet has a basic composition containing: Fe: 0.01 to 0.50% and P: 0.01 to 0.15%, with the remainder of Cu and inevitable impurities.

The copper alloy sheet may further selectively contain elements such as Zn and Sn, which will be described later, relative to the basic composition. It is also acceptable that the copper alloy sheet contains elements (impurity elements) other than the described elements, as far as they do not impair the properties of the present invention. It is noted that all of the contents of alloy elements and impurity elements are represented by mass %.

(Fe)

Fe is a major element that precipitates as Fe or a Fe-group intermetallic compound to increase strength and softening resistance of a copper alloy. When an Fe content is too small, precipitation of a compound is insufficient and contribution to the increase in the strength is insufficient, resulting in decreased strength even if the final cold-rolling is performed under the heavy-working conditions, while improvement of electric conductivity is satisfied. On the other hand, when an Fe content is too large, electric conductivity is decreased. In addition, strength and softening resistance are adversely deteriorated. Accordingly, an Fe content should be within the range of 0.01 to 0.50%, preferably 0.15 to 0.35%.

(P)

P is a major element serving as forming a compound with Fe to increase strength of a copper alloy, in addition to having a deoxidizing action. When a P content is too small, precipitation of a compound is insufficient, and contribution to increase in the strength is insufficient, resulting in decreased strength even if the final cold-rolling is performed under the heavy-working conditions, while improvement of electric conductivity is satisfied. On the other hand, when a P content is too large, not only electric conductivity but also hot workability are deteriorated, causing a crack to easily occur. Accordingly, a P content should be within the range of 0.01 to 0.15%, preferably 0.05 to 0.12%.

(C, O, H)

In the Present Invention, the Copper Alloy Sheet Preferably Further contains C: 3 to 15 ppm, and contents of O and H are preferably regulated so as to be 40 ppm or less and 1.0 ppm or less, respectively. With contents of C, 0, and H being within the above ranges, a copper alloy sheet that is further provided with excellent platability in addition to the above properties, can be obtained. Contents of C, 0, and H will be described in detail later.

(Zn)

Zn improves softening resistance of peel off of the soldering and the Sn plating of a copper alloy, which are essential for lead frames or the like; therefore, Zn is an element to be optionally added when these effects are needed. When a Zn content is less than 0.005%, a desired effect cannot be obtained. On the other hand, when exceeding 3.0%, not only solder wettability is deteriorated but also electric conductivity is significantly decreased. Accordingly, a Zn content should, when optionally contained, be selected within the range of 0.005 to 3.0% in accordance with (in consideration of) the balance between the electric conductivity and the softening resistance of peel off of the soldering and the Sn plating that are requested of the application.

(Sn)

Sn contributes to an increase in strength of a copper alloy; therefore, Sn is an element to be optionally added when the effect is needed. When an Sn content is less than 0.001%, it does not contribute to providing high strength. On the other hand, when an Sn content is large, the effect of Sn is saturated to conversely incur a decrease in electric conductivity. Accordingly, an Sn content should, when optionally contained, be selected within the range of 0.001 to 5.0% in accordance with (in consideration of) the balance between the strength (hardness) and the electric conductivity that are requested of the application.

(S, Pb)

In the copper alloy sheet according to the present invention, it is preferable that both contents of S and Pb are regulated so as to be 20 ppm or less, respectively. S and Pb impair not only the basic properties necessary when used in semiconductor lead frames or the like, such as strength, hardness, and electric conductivity, but also the Ag platability.

(Contents of Mn, Mg, Ca)

Mn, Mg, and Ca contribute to improvement of hot workability of a copper alloy; hence, these elements are optionally contained when the effect is needed. When a total content of one or more elements selected from Mn, Mg, and Ca is less than 0.0001%, a desired effect cannot be obtained. On the other hand, when a total content thereof exceeds 1.0%, not only strength and softening resistance of a copper alloy are decreased but also electric conductivity is drastically decreased, due to generation of coarse dispersoids and oxides. Accordingly, these elements should be optionally contained in a total content of 0.0001 to 1.0%.

(Contents of Zr, Ag, Cr, Cd, be, Ti, Co, NI, Au, Pt)

These elements are effective for increasing strength of a copper alloy; hence, they are optionally contained when the effect is needed. When a total content of one or more elements selected from these elements is less than 0.001%, a desired effect cannot be obtained. On the other hand, when a total content thereof exceeds 1.0%, it is not preferable because not only strength and softening resistance of a copper alloy are decreased but also electric conductivity is drastically decreased due to generation of coarse dispersoids and oxides. Accordingly, these elements should be optionally contained in a total content of 0.001 to 1.0%. When these elements are contained in conjunction with the above Mn, Mg, and Ca, a total content of these contained elements should be 1.0% or less.

(Contents of Hf, Th, Li, Na, K, Sr, Pd, W, Si, Nb, Al, V, Y, Mo, In, Ga, Ge, As, Sb, Bi, Te, B, and Misch Metal)

These elements are impurity elements, and when a total content of these elements exceeds 0.1%, strength and softening resistance thereof are decreased due to generation of coarse dispersoids and oxides. Accordingly, a total content of these elements is preferably 0.1% or less.

(Production Condition)

Preferable production conditions for making the structure of a copper alloy sheet compatible with the above-described structure specified by the present invention, will be described below. The copper alloy sheet according to the present invention does not require the normal production process per se to be changed drastically and can be produced through the same process as the normal one, except the preferable cold-rolling and cleaning conditions for controlling the afore-mentioned Ra, Rmax, and Rku of the surface of the copper alloy sheet, which will be described later.

That is, a copper alloy melt adjusted so as to have the above-described preferable component composition is at first cast. An obtained ingot is subjected to facing, and to a heat treatment or a homogenization heat treatment, and then to hot-rolling, followed by cooling with water. The hot-rolling may be performed under the normal conditions.

Thereafter, primary cold-rolling referred to as intermediate rolling is performed, followed by annealing and cleaning, and still further by finish (final) cold-rolling and low-temperature annealing (final annealing, finish annealing), such that a copper alloy sheet or the like having a product sheet thickness is produced. These annealing and cold-rolling may be performed repeatedly. For example, in the case of a copper alloy sheet used in semiconductor materials for lead frames or the like, a product sheet thickness is about 0.1 to 0.4 mm.

A solution treatment and a quenching treatment by water-cooling of the copper alloy sheet may be performed before the primary cold-rolling. At the time, a solution treatment temperature is selected, for example, within the range of 750 to 1000° C.

(Final Cold-Rolling)

The final cold-rolling is also performed in the normal process. In order to provide the tensile strength of 500 MPa or more and the hardness of 150 Hv or more to a Cu—Fe—P alloy sheet in which the contents of solid solution strengthening elements are strictly limited, a working-ratio in the final cold-rolling is determined on the side of the heavy-working in a relation with the working ratio in the cold-rolling so far.

A minimum reduction ratio per one pass (cold-rolling ratio) in the final cold-rolling is preferably 20% or more. When a minimum reduction ratio per one pass in the final cold-rolling is less than 20%, a thickness strain becomes large, resulting in deteriorated bendability.

In the final cold-rolling, the surface roughness of a rolling roll to be used is controlled such that, on the surface of a Cu—Fe—P alloy sheet, a centerline average roughness Ra is 0.2 μM or less and a maximum height Rmax is 1.5 μm or less.

Specifically, a bright roll (surface polished roll) is used in which a centerline average roughness Ra and a maximum height Rmax of the surface roughness of the rolling roll is fined so as to be 0.2 μm or less and 1.5 μm or less, respectively, in the same way as the surface of the rolled copper alloy sheet.

(Final Annealing)

In the Cu—Fe—P alloy sheet of which surface is controlled such that a centerline average roughness Ra is 0.2 μm or less and a maximum height Rmax is 1.5 μm or less in the final cold-rolling, the final annealing is preferably performed in a continuous heat treatment furnace. The finish annealing is preferably performed under a low-temperature condition of 100 to 400° C. for 0.2 minutes or more and 300 minutes or less. In the usual production process for producing a copper alloy sheet used for typical lead frames, the final annealing is not performed after the final cold-rolling in order to avoid a decrease in strength, except the annealing for relieving a stress (350° C. for about 20 seconds). In the present invention, however, the decrease in strength can be suppressed by the above-described cold-rolling conditions and by a lowered temperature in the final annealing. And, bendability or the like can be improved by performing the final annealing at a low-temperature.

When an annealing temperature is lower than 100° C., or an annealing time is less than 0.2 minutes, or this low-temperature annealing is not performed, there is a high probability that the structure and properties of the copper alloy sheet are hardly changed from the state after the final cold-rolling. Conversely, when the annealing is performed at a temperature exceeding 400° C., or the annealing is performed for more than 300 minutes, recrystallization occurs, rearrangement and recovery phenomena of the dislocation occur excessively, and precipitates become coarse; therefore, there is a high probability that stampability and strength of the sheet are decreased.

(Cleaning Treatment)

The surface of the Cu—Fe—P alloy sheet is controlled such that Rku is 5.0 or less by a cleaning treatment entailing chemical etching after the final annealing. In the cleaning treatment, commercially available detergents can be appropriately used, as far as the cleaning treatment entails chemical etching by which Rku is ensured to be 5.0 or less.

As a measure to ensure that Rku is 5.0 or less, a cleaning treatment entailing acid etching is preferable in which a copper alloy sheet is dipped in an aqueous sulfuric acid solution (room temperature) with a concentration of 5 to 50 mass % for 1 to 60 seconds. When a concentration of sulfuric acid is less than 5 mass % and a dipping time is less than 1 second, cleaning or etching of the matrix surface is insufficient, and hence there is a high probability that Rku cannot be 5.0 or less. On the other hand, when a concentration of sulfuric acid is more than 50 mass % and a dipping time is more than 60 seconds, cleaning or etching of the matrix surface is uneven, and hence there is also a probability that Rku cannot be 5.0 or less.

Second Embodiment

Cu—Fe—P Alloy Sheet with High Strength and Excellent Bendability (r Value)

In the present invention, r value parallel to the rolling direction of a Cu—Fe—P alloy sheet should be 0.3 or more, in order to improve bendability of the copper alloy sheet provided with the tensile strength of 500 MPa or more and the hardness of 150 Hv or more, as stated above. The r value is preferably 0.35 or more and 0.5 or less.

As stated above, in a Cu—Fe—P alloy sheet that is provided with high strength by increasing an amount of the work-hardening by the heavy-working with an increase in a working ratio in the cold-rolling, the alloy sheet has significant anisotropy of crystal orientation in which grain size is significantly elongated in the rolling direction.

As a result, in a Cu—Fe—P alloy sheet after being subjected to the cold-rolling, r value perpendicular to the rolling direction is necessarily larger than that parallel thereto.

In a Cu—Fe—P alloy sheet according to the present invention, bending works thereof are entirely performed in the direction parallel to the rolling direction, for the above applications such as lead frames; that is, Good Way bending (bending axis is perpendicular to the rolling direction) is performed.

Accordingly, the present invention specifies the r value parallel to the rolling direction of a copper alloy sheet, which becomes necessarily small, mainly for the purpose of improving the Good way bending. In other words, when the r value (parallel to the rolling direction of a copper alloy sheet) that becomes necessarily small by performing the afore-mentioned cold-rolling for providing high strength, is made large, the other r value (perpendicular to the rolling direction) that becomes necessarily large likewise, becomes larger.

For example, when the r value parallel to the rolling direction of a copper alloy sheet is made 0.3 or more, the other r value perpendicular to the rolling direction becomes necessarily larger or equal to roughly 0.4.

(Measurement of r Value)

The r value parallel to the rolling direction of a copper alloy sheet is determined by a tensile test using a test piece in accordance with JIS 5, the test piece being made in a way that the direction parallel to the rolling direction of the sheet is the longitudinal direction of the test piece. A tensile test is conducted at a fixed tension rate of 10 mm/min, after the above JIS 5 test piece is fixed to a tensile tester, and then an extensometer is fixed thereto, for reproducibility.

The r value is calculated by the following equation, using a vertical modulus gauge value L (initial value $L_0$) and a horizontal modulus gauge value W (initial value $W_0$) or the like, in order to calculate from a reduction ratio of a sheet thickness to a sheet width of a material between 0 point and 0.5% strain point, as a plastic strain ratio: r value=$\ln(W/W_0)/[\ln(L/L_0)-\ln(W/W_0)]$.

(Component Composition of Copper Alloy Sheet)

In the present invention, a copper alloy sheet is required to have the basic properties for semiconductor lead frames or the like, such as high strength of which tensile strength is 500 MPa or more and of which hardness of 150 Hv or more. The copper alloy sheet has excellent platability by which the unusual precipitation of the plating are prevented, in addition to satisfying these basic properties, or on the premise that these basic properties are not deteriorated. For this purpose, the Cu—Fe—P alloy sheet has a basic composition containing: Fe: 0.01 to 0.50% and P: 0.01 to 0.15%, with the remainder of Cu and inevitable impurities.

The copper alloy sheet may further selectively contain elements such as Zn and Sn, which will be described later, relative to the basic composition. It is also acceptable that the copper alloy sheet contains elements (impurity elements) other than the described elements, as far as they do not impair the properties of the present invention. It is noted that all of the contents of alloy elements and impurity elements are represented by mass %.

(Fe)

Fe is a major element that precipitates as Fe or a Fe-group intermetallic compound to increase strength and softening resistance of a copper alloy. When an Fe content is too small, contribution to the increase in the strength is insufficient, resulting in decreased strength even if the final cold-rolling is performed under the heavy-working conditions, while improvement of electric conductivity is satisfied. On the other hand, when an Fe content is too large, electric conductivity is decreased. In addition, because an amount of dispersoids is large and the dispersoids are starting points for breaks, strength and softening resistance are adversely deteriorated. Accordingly, an Fe content should be within the range of 0.01 to 0.50%, preferably 0.15 to 0.35%.

(P)

P is a major element serving as forming a compound with Fe to increase strength of a copper alloy, in addition to having a deoxidizing action. When a P content is too small, precipitation of a compound is insufficient, and contribution to increase in the strength is insufficient, resulting in decreased strength even if the final cold-rolling is performed under the heavy-working conditions, while improvement of electric conductivity is satisfied. On the other hand, when a P content is too large, not only electric conductivity but also hot workability are deteriorated, causing a crack to easily occur. Accordingly, a P content should be within the range of 0.01 to 0.15%, preferably 0.05 to 0.12%.

(Other Elements)

The contents of Zn, Sn, Mn, Mg, Ca, Zr, Ag, Cr, Cd, Be, Ti, Co, Ni, Au, Pt, S, Pb, Hf, Th, Li, Na, K, Sr, Pd, W, Si, Nb, Al, V, Y, Mo, In, Ga, Ge, As, Sb, Bi, Te, B, and misch metal, may be the same as with First Embodiment.

(Production Condition)

Preferable production conditions for making the structure of a copper alloy sheet compatible with the above-described structure specified by the present invention, will be described below. The copper alloy sheet according to the present invention does not require the normal production process per se to be changed drastically and can be produced through the same process as the normal one, except the preferable final low-temperature continuous annealing conditions, which will be described later.

That is, a copper alloy melt adjusted so as to have the above-described preferable component composition is at first cast. An obtained ingot is subjected to facing, and to a heat treatment or a homogenization heat treatment, and then to hot-rolling, followed by cooling with water. The hot-rolling may be performed under the normal conditions.

Thereafter, primary cold-rolling referred to as intermediate rolling is performed, followed by annealing and cleaning, and still further by finish (final) cold-rolling and low-temperature annealing (final annealing, finish annealing), such that a copper alloy sheet or the like having a product sheet thickness is produced. These annealing and cold-rolling may be performed repeatedly. For example, in the case of a copper alloy sheet used in semiconductor materials for lead frames or the like, a product sheet thickness is about 0.1 to 0.4 mm.

A solution treatment and a quenching treatment by water-cooling of a copper alloy sheet may be performed before the primary cold-rolling. At the time, a solution treatment temperature is selected, for example, within the range of 750 to 1000° C.

(Final Cold-Rolling)

The final cold-rolling is also performed in the normal process. In order to provide the tensile strength of 500 MPa or more and the hardness of 150 Hv or more to a Cu—Fe—P alloy sheet in which the contents of solid solution strengthening elements are strictly limited, a working-ratio in the final cold-rolling is determined on the side of the heavy-working in a relation with the working ratio in the cold-rolling so far.

A minimum reduction ratio per one pass (cold-rolling ratio) in the final cold-rolling is preferably 20% or more. When a minimum reduction ratio per one pass in the final cold-rolling is less than 20%, a compressive force occurring in the direction of the sheet width is small, and hence a thickness strain becomes large, causing r value not to be increased.

(Final Annealing)

Conditions of the final low-temperature annealing performed after the final cold-rolling have significant influence on the r value parallel to the rolling direction of a Cu—Fe—P alloy sheet. With respect to the point, in the present invention, the r value parallel to rolling direction of the sheet is controlled so as to be 0.3 or more, as stated above; and for the purpose, the low-temperature annealing is performed by a continuous annealing, and at the time, an appropriate tension within the range of 0.1 to 8 $kgf/mm^2$ is applied to a passing sheet. Thereby, a tension-compression stress with a small change of sheet thickness is provided. The r value of the sheet is increased by the plastic stress.

When the tension is too small, that is, less than 0.1 $kgf/mm^2$, a tension loaded on the sheet is insufficient, and hence the r value parallel to the rolling direction of a Cu—Fe—P alloy sheet is not larger or equal to 0.3, depending on equipment conditions and sheet thickness. On the other hand, when the tension is too large, that is, more than 8 $kgf/mm^2$, a passing sheet having a thin thickness within the afore-mentioned range of 0.1 to 0.4 mm, tends to easily break, depending on equipment conditions and sheet thickness.

The conditions of the final low-temperature continuous annealing have significant influence on the basic properties such as strength and elongation or the like, as well as the r value. With respect to this point, in the present invention, the final continuous annealing performed in a continuous heat treatment furnace is preferably performed under low-temperature conditions, that is, at a temperature of 100 to 400° C. for 0.2 minutes or more and 300 minutes or less. In the usual production process for producing a copper alloy sheet used for typical lead frames, the final annealing is not performed after the final cold-rolling, in order to avoid a decrease in strength, except the annealing for relieving a stress (350° C. for about 20 seconds). In the present invention, however, a decrease in strength can be suppressed by a lowered temperature in the final annealing. And, bendability or the like can be improved by the final annealing performed at a low-temperature.

When a continuous annealing temperature is lower than 100° C., or an annealing time is less than 0.2 minutes, or this low-temperature annealing is not performed, there is a high probability that the structure and properties of the copper alloy sheet are hardly changed from the state after the final cold-rolling. Conversely, when the annealing is performed at an temperature exceeding 400° C., or the annealing is performed for more than 300 minutes, recrystallization occurs, rearrangement and recovery phenomena of the dislocation occur excessively, and precipitates become coarse; therefore, there is a high probability that the stampability and the strength of the sheet are decreased.

A line speed during the continuous annealing is preferably controlled so as to be within the range of 10 to 100 m/min. When the line speed is too slow, recovery and recrystallization of a material progress too much. Accordingly, the strength and the elongation are decreased. However, the line speed is not needed to be faster exceeding 100 m/min, because of constraint (capacity limit) of the equipment and of a possibility of discontinuity of sheets in the continuous annealing.

On the other hand, in the batch-type final annealing, tension cannot be applied to a sheet during annealing, and hence the r value parallel to the rolling direction of a Cu—Fe—P alloy sheet is not improved. And, the basic properties such as strength and elongation cannot be obtained because of the same reasons as with the case where a line speed is too slow in the continuous annealing.

Third Embodiment

Cu—Fe—P Alloy Sheet with High Strength and Excellent Stampability at Stamping Process Importance of each requirement for satisfying required properties of a Cu—Fe—P alloy sheet according to the present invention used for semiconductor lead frames or the like, and an embodiment of the invention will be described specifically below.
(Component Composition of Copper Alloy Sheet)

In the present invention, a copper alloy sheet preferably has basic properties as a material used for semiconductor lead frames or the like, such as the high strength of which tensile strength is 500 MPa or more, and the hardness of 150 Hv or more or the like. The copper alloy sheet according to the present invention has excellent stampability in addition to satisfying these basic properties, or on the premise that these basic properties are not deteriorated. For this purpose, the Cu—Fe—P alloy sheet has a basic composition containing: Fe: 0.01 to 0.50% and P: 0.01 to 0.15%, with the remainder of Cu and inevitable impurities.

In the present invention, the copper alloy sheet may further selectively contain elements such as Zn and Sn, which will be described later, relative to the basic composition. It is also acceptable that the copper alloy sheet contains elements (impurity elements) other than the described elements, as far as they do not impair the properties of the present invention. It is noted that all of the contents of alloy elements and impurity elements are represented by mass %.
(Fe)

Fe is a major element that precipitates as Fe or an Fe-group intermetallic compound to increase strength and softening resistance of a copper alloy. When an Fe content is too small, precipitation of the above precipitated particles is small under a certain production condition, and hence contribution to an increase in the strength is insufficient, resulting in decreased strength, while improvement of electric conductivity is satisfied. On the other hand, when an Fe content is too large, electric conductivity and the Ag platability are deteriorated. In the case, when intending to increase a precipitation amount of the above precipitated particles in order to increase electric conductivity forcedly, it causes the precipitated particles to develop and to be coarse. Thereby, the strength and the tensile property specified by the present invention cannot be obtained, resulting in decreased stampability. Accordingly, an Fe content should be within the range of 0.01 to 0.50%, preferably 0.15 to 0.35%.
(P)

P is a major element serving as forming a compound with Fe to increase strength of a copper alloy, in addition to having a deoxidizing action. When a P content is too small, precipitation of a compound is insufficient under a certain production condition, and hence desired strength cannot be obtained. On the other hand, when a P content is too large, not only electric conductivity is decreased but also the tensile property specified by the present invention cannot be obtained, resulting in the decreased hot workability and stampability. Accordingly, a P content should be within the range of 0.01 to 0.15%, preferably 0.05 to 0.12%.
(Other Elements)

The contents of Zn, Sn, Mn, Mg, Ca, Zr, Ag, Cr, Cd, Be, Ti, Co, Ni, Au, Pt, S, Pb, Hf, Th, Li, Na, K, Sr, Pd, W, Si, Nb, Al, V, Y, Mo, In, Ga, Ge, As, Sb, Bi, Te, B, and misch metal, may be the same as with First Embodiment.
(Tensile Properties of Sheet)

In the present invention, on the premise of the afore-mentioned component composition, tensile properties of a Cu—Fe—P alloy sheet, such as tensile modulus and ratio of the uniform elongation to the total elongation, are specified as stated above, and thereby excellent stampability of the alloy sheet can be ensured, wherein the two measurements are determined by a tensile test using a test piece taken the width direction (right-angled direction) of the alloy sheet, which is perpendicular to the rolling direction of the alloy sheet, as the longitudinal direction of the test piece.
(Tensile Modulus)

At first, the tensile modulus (Young's modulus) of a Cu—Fe—P alloy sheet, which is determined by a tensile test, should be more than 120 GPa. The tensile modulus (Young's modulus) is preferably 125 GPa or more. As the tensile modulus is larger, an accumulated amount of strains that are loaded on a sheet when the sheet is stamped, is smaller. Accordingly, a stamping break occurs at an early time during a stamping process, and thereby a shear plane ratio is small, leading to the improved stampability.

On the other hand, when the tensile modulus is small, that is, less than or equal to 120 GPa, an accumulated amount of strains that are loaded on a sheet during a stamping process, is large. Accordingly, a stamping break does not occur during a stamping process, and thereby a shear plane ratio is large, resulting in the deteriorated stampability.

The reasons why the tensile modulus is as low as 120 GPa include, particularly in a Cu—Fe—P alloy sheet, the following major reasons, although other reasons can be also considered: homogenization of the structure of a sheet is insufficient (the structure of a sheet is inhomogeneous) upon a homogenization heat treatment or a heating treatment prior to the hot-rolling, which is described later; a temperature at the start of cooling with water after the hot-rolling, is too low; or a line speed during the batch-type final annealing or even during the continuous final annealing, is slow or the like.

(Uniform Elongation/Total Elongation)

Next, a ratio of the uniform elongation to the total elongation or uniform elongation/total elongation, of a Cu—Fe—P alloy sheet, which is determined by a tensile test, should be less than 0.50, preferably less than 0.45. As uniform elongation/total elongation is larger, that is, 0.50 or more, in other words, as a ratio of the uniform elongation to the total elongation is larger, the sheet (material) is ductilely deformed upon stamping. Due to this, a deformation amount up to a break upon stamping is larger, and hence a shear plane ratio is large, resulting in the decreased stampability. On the other hand, when uniform elongation/total elongation is less than 0.50, a break caused by stamping occurs at an early time upon stamping, and hence a shear plane ratio is small, leading to the improved stampability.

The reasons why the uniform elongation/total elongation is as large as 0.5 or more include the reasons to be as follows: in a Cu—Fe—P alloy sheet, in particular, an amount of precipitates in the sheet structure is insufficient because a temperature at the start of the cooling with water after the hot-rolling is too high; recovery and recrystallization of a material progress too much because a temperature of the intermediate annealing is too high; an amount of precipitates in the sheet structure is insufficient because a period of the intermediate annealing is too short; and a line speed during the batch-type final annealing or even during the continuous final annealing, is slow, or the like.

(Tensile Test)

A tensile test by which the tensile modulus and a ratio of the uniform elongation to the total elongation specified by the present invention, are determined (measured), are carried out under the following test conditions, for reproducibility. A test piece is one in accordance with JIS 5, which is taken from a Cu—Fe—P alloy sheet thus obtained (produced) in a way that the longitudinal direction of the test piece is to be the direction perpendicular to the rolling direction of the alloy sheet. A tensile test is conducted at a fixed tension speed of 10 mm/min, after the above test piece is fixed to a tensile tester and an extensometer is then fixed thereto. The universal tester 5882 made by Instron is preferable to be used.

Tensile strength is determined from values obtained by measurement using the tester, and the total elongation is determined by measuring the distance between two marks with test pieces butt jointed after testing. Tensile modulus and total elongation are determined from values obtained by the extensometer.

(Production Processes)

Preferable production conditions for making the structure of a copper alloy sheet compatible with the above-described structure specified by the present invention, will be described below. As stated above, the tensile modulus and a ratio of the uniform elongation to the total elongation, which are specified by the present invention, are naturally affected greatly by a component composition of a Cu—Fe—P alloy sheet, and also affected greatly by the production processes and the production conditions; hence, such properties cannot be determined only by a component composition. Regarding this point, in order to obtain the tensile properties such as the tensile modulus and a ratio of the uniform elongation to the total elongation that are specified by the invention as stated above, the production processes and the production conditions of a Cu—Fe—P alloy sheet such as a homogenization heat treatment, a temperature at the start of cooling with water after the hot-rolling, a temperature of the intermediate annealing, and a line speed during the final continuous annealing, should be controlled as follows:

That is, a copper alloy melt adjusted so as to have the above-described component composition of the present invention is at first cast. Melting and casting is performed in a normal process such as the continuous casting and the semi-continuous casting, and it is preferable that a copper melting material with less contents of S and Pb is used in order to limit contents of S and Pb as stated above. Prior to the homogenization heat treatment or the heating treatment of the ingot, the ingot is subjected to a normal facing.

(Homogenization Heat Treatment or Heating Treatment)

Homogenization of the structure of a sheet is insufficient (the structure of a sheet is inhomogeneous) upon the homogenization heat treatment or the heating treatment of the ingot prior to the hot-rolling, the structure of a Cu—Fe—P alloy sheet that is finally obtained is also inhomogeneous, resulting in that not only the strength is decreased but also the tensile modulus is as low as 120 Gpa. Accordingly, the homogenization heat treatment or the heating treatment of an ingot is preferably to be performed at a temperature of at least 900° C. for 2 hours or more, in accordance with the thickness or the size of the ingot.

(Hot-Rolling)

The hot-rolling is begun at a temperature of 900° C. or more, and after the hot-rolling is finished, cooling with water of the hot-rolled sheet is begun at a temperature of 700° C. to 800° C. When a temperature at the start of the cooling with water after the hot-rolling is finished, is higher than 800° C., precipitates in the structure are not formed due to the high temperature at the start of the cooling, resulting in that an amount of precipitates is insufficient. Thereby, a ratio of the uniform elongation to the total elongation is large, that is, a ratio of the uniform elongation to the total elongation is not less than 0.50.

On the other hand, when a temperature at the start of the cooling with water after the hot-rolling is finished, is less than 700° C., the grain size is too fine, and not only the tensile modulus is decreased but also a ratio of the uniform elongation to the total elongation is too large; therefore, a ratio thereof also is not less than 0.50. In addition, the strength is decreased due to generation of coarse precipitates.

Subsequently, the primary cold-rolling referred to as the intermediate rolling is performed on the sheet that is cooled with water after the hot-rolling is finished, followed by an annealing and a cleaning. Furthermore, a finish (final) cold-rolling and a final annealing (low-temperature annealing, finish annealing) are performed so that a copper alloy sheet or the like having a product sheet thickness is produced. These annealing and cold-rolling may be performed repeatedly. For example, when a copper alloy sheet is used for a semiconductor material for lead frames or the like, the product sheet thickness is about 0.1 to 0.4 mm.

(Intermediate Annealing)

In the above processes, the conditions of the intermediate annealing also affect greatly a ratio of the uniform elongation to the total elongation. The intermediate annealing in which a ratio of the uniform elongation to the total elongation is less than 0.50, is performed at a temperature of 430° C. or less for 5 hours or more. When a temperature of the intermediate annealing is too high, not only recovery and recrystallization of a material progress too much, causing the strength to be decreased, but also a ratio of the uniform elongation to the total elongation is too large, resulting in that the ratio is not less than 0.50. When a period of the intermediate annealing is too short, an amount of precipitates formed in the structure of a sheet is insufficient, resulting in decreased electric conductivity.

(Final Annealing)

In the above processes, the conditions of the final annealing greatly affect the tensile modulus and a ratio of the uniform elongation to the total elongation. In order to obtain such properties of a Cu—Fe—P alloy sheet that the tensile modulus exceeds 120 GPa and a ratio of the uniform elongation to the total elongation is less than 0.50, it is needed that a sheet (coil) is subjected to a continuous annealing in which a sheet (coil) continuously passes through a furnace and is processed.

In order to obtain such properties, a line speed during the final annealing is needed to be controlled so as to be within the range of 10 to 100 m/min. When the line speed is too slow, recovery and recrystallization of a material progress too much; hence, not only the strength is decreased but also a ratio of the uniform elongation to the total elongation is too large, that is, the ratio is not less than 0.50. The tensile modulus is also below 120 GPa. However, the line speed is not needed to be faster exceeding 100 m/min, because of constraint (capacity limit) of the equipment and of a possibility of discontinuity of sheets in the continuous annealing.

On the other hand, in the batch-type final annealing, the tensile modulus and a ratio of the uniform elongation to the total elongation in a tensile test that are specified by the present invention as stated above, cannot be obtained, because of the same reason as with the case where a line speed is too slow in the continuous annealing.

Fourth Embodiment

Cu—Fe—P Alloy Sheet with High Strength and Excellent Platability

Importance of each requirement for satisfying required properties of a Cu—Fe—P alloy sheet according to the present invention used for semiconductor lead frames or the like, and embodiments of the invention will be described specifically below.

(Component Composition of Copper Alloy Sheet)

In the present invention, a copper alloy sheet preferably has basic properties as a material used for semiconductor lead frames or the like, such as the high strength of which tensile strength is 500 MPa or more and of which hardness is 150 Hv or more or the like. The copper alloy sheet according to the present invention has excellent platability by which the unusual precipitation of the plating is prevented, in addition to satisfying these basic properties, or on the premise that these basic properties are not deteriorated. For this purpose, the Cu—Fe—P alloy sheet has a basic composition containing: Fe: 0.01 to 0.50% and P: 0.01 to 0.15%, with the remainder of Cu and inevitable impurities.

In the present invention, the copper alloy sheet is characterized by a component composition in which, relative to the basic composition, C is contained in an amount of 3 to 15 ppm and contents of O and H are regulated so as to be 40 ppm or less and 0.7 ppm or less, respectively.

The copper alloy sheet may further selectively contain elements such as Zn and Sn, which will be described later, relative to the basic composition. It is also acceptable that the copper alloy sheet contains elements (impurity elements) other than the described elements, as far as they do not impair the properties of the present invention. It is noted that all of the contents of alloy elements and impurity elements are represented by mass %.

(Fe)

Fe is a major element that precipitates as Fe or an Fe-group intermetallic compound to increase strength and softening resistance of a copper alloy. When an Fe content is too small, precipitation of the above precipitated particles is small under a certain production condition, and hence contribution to an increase in the strength is insufficient, resulting in decreased strength, while improvement of electric conductivity is satisfied. On the other hand, when an Fe content is too large, electric conductivity is decreased. In the case, when intending to increase a precipitation amount of the above precipitated particles in order to increase electric conductivity forcedly, it causes the precipitated particles to develop and to be coarse, resulting in decreased platability. In addition, strength and softening resistance are also deteriorated. Accordingly, an Fe content should be within the range of 0.01 to 0.50%, preferably 0.15 to 0.35%.

(P)

P is a major element serving as forming a compound with Fe to increase strength of a copper alloy, in addition to having a deoxidizing action. When a P content is too small, precipitation of a compound is insufficient under a certain production condition, and hence desired strength cannot be obtained. On the other hand, when a P content is too large, not only electric conductivity is decreased but also hot workability is decreased. Accordingly, a P content should be within the range of 0.01 to 0.15%, preferably 0.05 to 0.12%.

(C)

O and H are inevitably present in a Cu—Fe—P alloy sheet in certain contents, and they become starting points for inclusions and pores. O and H tend to agglomerate, and agglomeration thereof makes the formed inclusions and the pores coarse, which are stating points (cause) for the unusual precipitations of the Ag plating or the like. Inclusions and pores are usually present on the surface of a Cu—Fe—P alloy sheet; however, unless they are particularly coarse, they don't become the starting points for the above unusual precipitation such as Ag plating, as far as the sizes thereof are normal or fine.

C serves as suppressing agglomeration of O and H that are inevitably present in a Cu—Fe—P alloy sheet in certain amounts, and as increasing the starting points of inclusions and pores, and as making the sizes of the formed inclusions and pores normal or fine. Thereby, C prevents the formed inclusions and pores from being particularly coarse in their sizes, and prevents the inclusions and pores from being the starting points for the unusual precipitation of the above Ag plating or the like.

In order to exhibit the above function of C, it is necessary that C is contained in an amount of 3 ppm or more. When a C content is less than 3 ppm, there is not a significant difference from the C content in which C is naturally mixed therein; hence, the above function of C that prevents the unusual precipitation of Ag plating or the like, cannot be exhibited.

On the other hand, when a C content exceeds 15 ppm, more strictly 10 ppm, coarse carbides are formed, which adversely become the starting points (cause) of the above unusual precipitation of Ag plating or the like. As stated above, C is easy to disperse, and therefore it is very difficult that C is contained in an amount exceeding 15 ppm, even when an Fe—C base alloy is added in a melt stream as is in Patent Document 11.

Accordingly, a C content should be within the range of 3 to 15 ppm, preferably 3 to 10 ppm. It is noted that a C content is determined by heating a sample under oxygen atmosphere to extract carbon therein and by analyzing the carbon with a combustion-infrared absorption method, in accordance with JIS Z2615.
(O, H)

In the present invention, in order to ensure the operation effect of the above C, contents of O and H, which are starting points for inclusions and pores, are regulated. Specifically, an O content is regulated so as to be 40 ppm or less, preferably 20 ppm or less; and an H content is regulated so as to be 1.0 ppm or less, more preferably 0.5 ppm or less. When O content and/or H content are too large, the amounts of C and H on which C does not act are too large even when C is contained in an amount within the above range; and hence O and H agglomerate, causing the formed inclusions and pores to be coarse, which become the starting points (cause) of the above unusual precipitation of Ag plating or the like.

However, the higher limits of the contents of O and H specified by the present invention are not particularly lower (smaller) as compared to those of conventional techniques, nor particularly higher (larger). In other words, the contents are at normal concentration levels for a Cu—Fe—P alloy sheet. That is, the higher limits of the contents of O and H specified by the present invention, conform to the purpose that the above unusual precipitation of the plating can be prevented, even when oxygen and hydrogen are contained to some extent in the casting and melting process of the present invention.

An O content is determined by extracting O in a sample with an inert gas fusion method and by analyzing the O with a combustion-infrared absorption method, in accordance with JIS Z2613. An H content is determined by extracting H in a sample with an inert gas fusion method and by analyzing the H with a thermal conductivity method.
(Other Elements)

The contents of Zn, Sn, Mn, Mg, Ca, Zr, Ag, Cr, Cd, Be, Ti, Co, Ni, Au, Pt, S, Pb, Hf, Th, Li, Na, K, Sr, Pd, W, Si, Nb, Al, V, Y, Mo, In, Ga, Ge, As, Sb, Bi, Te, B, and misch metal, may be the same as with First Embodiment.
(Production Processes)

Preferable production conditions for making the structure of a copper alloy sheet compatible with the above-described structure specified by the present invention, will be described below. The copper alloy sheet according to the present invention does not require the normal production process per se to be changed drastically and can be produced through the same process as the normal one, except the preferable conditions for controlling the above contents of C, H, and O.

A copper alloy melt adjusted so as to have the above-described component composition of the present invention is at first cast. Melting and Casting is performed in a normal process such as continuous casting and semi-continuous casting. At the time, it is preferable that a copper melting material with smaller contents of S and Pb is used in order to limit the contents of the above S and Pb, because S and Pb are to be contained from the copper melting material.
(Control of C Content)

In the melting and casting process of a normal air melting furnace, sources of C solid solution dissolved into a melt are refractories of the furnace wall or a carbon composite for shielding air that is mounted on the melt in the air melting furnace, or the like. In a vacuum melting furnace, a source of C is refractories of the furnace wall. In the present invention, an amount of C dissolved from these sources into a melt can be controlled by controlling a temperature of a copper alloy melt (melting temperature) without using intentional measures for adding C such as addition of Fe—C base material.

As control of the temperature of a copper alloy melt, the temperature thereof in an air melting furnace or a vacuum melting furnace is a relatively high temperature of 1300° C. or more, while the temperature thereof in the normal melting process is less than about 1200° C. Of course, it is also possible that the C content of the present invention is satisfied by combining intentional measures for adding C such as use of a carbon crucible and addition of an Fe—C base material or the like, with the above control of the temperature of a copper alloy melt.

An amount of C (C content) dissolved from the above sources of C solid solution into a melt, is increased by raising the temperature of a copper alloy melt to such a high temperature, and thereby the C content specified by the present invention is satisfied. When the temperature of a copper alloy melt is less than 1300° C., an amount of the dissolved C is insufficient as is the case with a normal process; hence, an amount of C in the final Cu—Fe—P alloy sheet is less than 3 ppm. In the cases of an air melting furnace and a vacuum melting furnace, when an average cooling rate (solidification rate) from the start of casting to 600° C. is slow, C in the melt is likely to disperse halfway; hence, the average cooling rate is preferably to be as great as more than 5.0° C./s.
(Control of Contents of O and H)

In order to suppress increase in contents of O and H, it is important to suppress contact between a copper melt and air as few as possible, in the melting and casting process. For example, in the cases of a vacuum melting furnace (source of C solid solution is refractories of the furnace wall) and an air melting furnace, the average cooling rate (solidification rate) from the start of casting to 600° C. should be 5.0° C./s. As stated above, the average cooling rate is also effective for controlling a C content. Control of the atmosphere of an annealing furnace in the subsequent process is also effective for lowering contents of O and H.

Thereafter, an obtained ingot is subjected to facing, and to a heat treatment or a homogenization heat treatment, and then to hot-rolling, followed by cooling with water. Further, primary cold-rolling referred to as intermediate rolling is performed, followed by annealing and cleaning, and still further by finish(final)cold-rolling and low-temperature annealing (final annealing, finish annealing), such that a copper alloy sheet or the like having a product sheet thickness is produced. These annealing and cold-rolling may be performed repeatedly. For example, in the case of a copper alloy sheet used in semiconductor materials for lead frames or the like, a product sheet thickness is about 0.1 to 0.4 mm.

A solution treatment and a quenching treatment by water-cooling of a copper alloy sheet may be performed before the primary cold-rolling. At the time, a solution treatment temperature is selected, for example, within the range of 750 to 1000° C. A sheet that has been subjected to the final cold-rolling may be a final product sheet as it is, or may be subjected to the low-temperature annealing for relieving a strain.

EXAMPLES

Example 1

An example of the present invention will be described below. Cu—Fe—P alloy sheets having each component composition illustrated in Table 1 were respectively produced, with only the conditions of a cleaning treatment entailing chemical etching after the final annealing process, being changed variously as illustrated in Table 2. The resistance of peel off (peeling-off temperature) of an oxidation film formed on each copper alloy sheet was evaluated, results of which are shown in Table 2.

Specifically, copper alloys having each component composition illustrated in Table 1 were respectively melted in a coreless furnace, and thereafter ingots with their sizes of 70 mm in thickness×200 mm in width×500 mm in length were produced in the semi-continuous casting process. After the surface of each ingot was subjected to facing and a heat treatment, sheets with a thickness of 16 mm were prepared by being subjected to the hot-rolling at a temperature of 950° C., which were quenched in water from a temperature of 750° C. or more. The oxidized scale was removed, and thereafter the primary cold-rolling (intermediate rolling) was performed. The resulting sheet was subjected to facing, and thereafter the final cold-rolling was performed in which 4 passes of the cold-rolling were performed with the intermediate annealing therebetween. Subsequently, the final continuous annealing was performed under the low-temperature conditions of 350° C. for 20 seconds, such that a copper alloy sheet with a thickness of 0.15 mm that corresponds to the thinning of lead frames, was obtained.

In the final cold-rolling, a bright roll (surface polished roll) was used in common among each sheet, in which: a minimum reduction ratio per one pass is 30%; a centerline average roughness Ra of the surface of the roll is 0.2 μm or less; and a maximum height Rmax thereof is 1.5 μm or less.

After the final continuous annealing, the Cu—Fe—P alloy sheet was subjected to a cleaning treatment entailing chemical etching in which the sheet was dipped in an aqueous sulfuric acid solution (room temperature) under the conditions illustrated in Table 2, and thereby Rku of the surface of the sheet was controlled.

In each copper alloy illustrated in Table 1, the remaining element other than the described elements is Cu, and as other impurity elements, a total content of Hf, Th, Li, Na, K, Sr, Pd, W, S, Si, C, Nb, Al, V, Y, Mo, Pb, In, Ga, Ge, As, Sb, Bi, Te, B, and misch metal was less than 0.1 mass %.

In the case where one or more elements selected from Mn, Mg, and Ca were contained, a total content thereof was to be within the range of 0.0001 to 1.0 mass %; and in the case where one or more elements selected from Zr, Ag, Cr, Cd, Be, Ti, Co, Ni, Au, and Pt were contained, a total content thereof was to be within the range of 0.001 to 1.0 mass %; and further a total content of these whole elements was to be 1.0 mass % or less.

In each example, a sample was taken from each copper alloy sheet thus obtained, such that the properties such as tensile strength, hardness, and electric conductivity; and a centerline average roughness Ra, a maximum height Rmax, and Kurtosis (degree of peakedness) of the roughness curve, in measurement of surface roughness in accordance with JIS B0601, were measured. These results are illustrated in Table 2, respectively.

(Measurement of Surface Roughness)

A centerline average roughness Ra (μm), a maximum height Rmax (μm), and Kurtosis (degree of peakedness) of roughness curve, of the surface of the test piece of the obtained copper alloy sheet, were measured by using a surface roughness tester made by TOKYO SEIMITSU CO., LTD (Product: SURFCOM 1400D) in accordance with JIS B0601. Measurements were conducted for each 4.0 mm in length at 3 arbitrarily selected points (three places) in the test piece, results of which were averaged.

(Measurement of Hardness)

A test piece with a size of 10×10 mm was taken from each copper alloy sheet thus obtained. Hardness of the test piece was measured at 4 points of the test piece, with a micro Vickers hardness tester made by MATSUZAWA CO., LTD (Product: "Micro Vickers Hardness Tester") by applying a load of 0.5 kg, and an average value thereof was taken as the hardness of the test piece.

(Measurement of Electric Conductivity)

After the copper alloy sheet sample was processed into a slip-shaped test piece with a size of 10 mm in width×300 mm in length by milling and an electric resistance thereof was measured with a double bridge resistance meter, the electric conductivity thereof was calculated by an average cross-sectional area method.

(Resistance of Peel Off of Oxidation Film)

The resistance of peel off of an oxidation film of each test piece was evaluated by a critical temperature at which the oxidation film is peeled off, in a tape peeling test. The tape peeling test was conducted as follows: a test piece with a size of 10×30 mm was cut out from the copper alloy sheet thus obtained; the test piece was heated at a certain temperature for 5 minutes in the air; and a commercially available tape (Product: Mending Tape made by Sumitomo 3M Limited) was applied to the surface of the test piece where an oxidation film was generated, then the tape was peeled off. When a heating temperature was increased at intervals of 10° C., the lowest temperature at which the oxidation film was peeled off was determined to be a peeling temperature of the oxidation film.

When the peeling temperature of an oxidation film is equal to or higher than 350° C., it can be said that the resistance of peel off of the oxidation film is sufficient for an increased temperature of heating in the heating process for producing copper alloy sheets and lead frames.

The above heating for 5 minutes in the air specified by the present invention is relatively long, and therefore it can be said that the test condition for evaluating the resistance of peel off of oxidation film is more strict than the test condition in which heating is conducted at a temperature of 200 to 500° C. for a relatively shorter time of 3 minutes, as described in Patent Documents 2 and 3. In other words, the test of resistance of peel off of oxidation film according to the present invention in which heating is conducted for a relatively longer time, is associated with the resistance of peel off of oxidation film at an increased temperature of the heating in the heating process for producing copper alloy sheets and lead frames.

On the other hand, it can be said that the test conditions for evaluating resistance of peel off of oxidation film in which heating is conducted for a relatively shorter time of 3 minutes, as is disclosed in Patent Documents 2 and 3, is insufficient to be associated with the resistance of peel off of oxidation film at an increased temperature of heating in the heating process for producing copper alloy sheets and lead frames. That is, even if good results are obtained from the test conditions for evaluating resistance of peel off of oxidation film according to Patent Documents 2 and 3, the resistance of peel off of oxidation film at an increased temperature of heating in the heating process for producing copper alloy sheets and lead frames, is not always good.

As is clear from Tables 1 and 2, each of Inventive Examples 1 to 13 that are copper alloys having component compositions within the range specified by the present invention, has high strength with tensile strength of 500 MPa or more and hardness of 150 Hv or more. In addition, the centerline average roughness Ra of each copper alloy sheet in measurement of the surface roughness in accordance with JIS B0601, is 0.2 μm or less, and the maximum height Rmax thereof is 1.5 μm or less.

Furthermore, Inventive Examples 1 to 13 are subjected to a cleaning treatment by an aqueous sulfuric acid solution under a preferable condition after the final continuous annealing; hence, each Kurtosis (degree peakedness) of roughness curve thereof is 5.0 or less. As a result, each of them is provided with the excellent resistance of peel off of oxidation film in which a peeling temperature of oxidation film is 350° C. or more. Accordingly, each of Inventive Examples 1 to 13 has a high adhesion property between the resin and the die pad as a semiconductor base material in assembling semiconductor packages, leading to packages with high reliability.

On the other hand, Comparative Examples 14 and 15 are not subjected to a cleaning treatment by an aqueous sulfuric acid solution under a preferable condition after the final continuous annealing. Comparative Example 16 is too low in the concentration of the sulfuric acid used in the cleaning treatment by the aqueous sulfuric acid solution. Comparative Example 17 is too high in the concentration of the sulfuric acid used in the cleaning treatment by the aqueous sulfuric acid solution. Comparative Example 18 is too long in the dipping time in the cleaning treatment by the aqueous sulfuric acid solution. As results of these problems, each of Comparative Examples 14 to 18 has Kurtosis (degree of peakedness) of roughness curve exceeding 5.0.

On the other hand, Comparative Examples 14 to 18 are copper alloys having component compositions within the range specified by the present invention. Each of them has high strength with tensile strength of 500 MPa or more and the hardness of 150 HV or more, and the centerline average roughness Ra in measurement of the surface roughness is 0.2 µm or less, and the maximum height Ra is 1.5 µm or less. Nevertheless, because each of Comparative Examples 14 to 18 has Kurtosis (degree of peakedness) of roughness curve exceeding 5.0, a peeling temperature of oxidation film is less than 350° C., resulting in the decreased resistance peel off of oxidation film. Accordingly, each of Comparative Examples 14 to 18 has a poor adhesion property between the resin and the die pad as a semiconductor base material in assembling semiconductor packages, resulting in packages with low reliability.

Each of Comparative Examples 19 to 22 is subjected to a cleaning treatment by an aqueous sulfuric acid solution under a preferable condition after the final continuous annealing; hence each Kurtosis (degree peakedness) of roughness curve thereof is 5.0 or less. As a result, each of them is provided with the excellent resistance of peel off of oxidation film.

Nevertheless, an Fe content of Comparative Example 19 is out of the lower limit of 0.01%, and therefore Comparative Example 19 has too poor strength enough to be used as a semiconductor base material.

An Fe content of Comparative Example 20 is out of the higher limit of 5.0%; and therefore comparative example 20 has a remarkably decreased electric conductivity, and cannot be used as a semiconductor base material.

A P content of Comparative Example 21 is out of the lower limit of 0.01%, and therefore Comparative Example 21 has too poor strength enough to be used as a semiconductor base material.

A P content of Comparative Example 22 is out of the higher limit of 0.15%, and a crack occurred during the hot-rolling, and therefore trial production was stopped at the time.

From the above results, the critical importance of the component composition and the surface roughness of a copper alloy sheet of the present invention, which are for having excellent resistance of peel off of oxidation film in addition to high strength, can be supported; and the importance of the preferred production conditions for obtaining the surface roughness can also be supported.

TABLE 1

| Classification | No. | Component composition of copper alloy sheet (Remainder: Cu and impurities) | | | | |
|---|---|---|---|---|---|---|
| | | Fe | P | Sn | Zn | Others |
| Inventive example | 1 | 0.28 | 0.12 | 0.11 | 0.31 | — |
| | 2 | 0.28 | 0.12 | 0.11 | 0.31 | — |
| | 3 | 0.28 | 0.12 | 0.11 | 0.31 | — |
| | 4 | 0.030 | 0.010 | 0.10 | 0.29 | — |
| | 5 | 0.49 | 0.14 | 0.11 | 0.30 | — |
| | 6 | 0.29 | 0.11 | — | — | — |
| | 7 | 0.27 | 0.10 | 0.005 | — | — |
| | 8 | 0.28 | 0.11 | — | 0.005 | — |
| | 9 | 0.25 | 0.084 | 5.0 | — | Mg: 0.005 |
| | 10 | 0.26 | 0.086 | — | 3.0 | Co: 0.10 |
| | 11 | 0.26 | 0.085 | 0.020 | 0.25 | Mn: 0.003, Ni: 0.025 |
| | 12 | 0.27 | 0.084 | 0.022 | 0.26 | Ca: 0.002, S: 0.003 |
| | 13 | 0.26 | 0.085 | 0.019 | 0.25 | Zr: 0.020, B: 0.005 |
| Comparative example | 14 | 0.28 | 0.12 | 0.78 | 0.28 | — |
| | 15 | 0.49 | 0.14 | 0.11 | 0.30 | — |
| | 16 | 0.28 | 0.12 | 0.11 | 0.31 | — |
| | 17 | 0.28 | 0.12 | 0.11 | 0.31 | — |
| | 18 | 0.28 | 0.12 | 0.11 | 0.31 | — |
| | 19 | 0.004 | 0.01 | 0.10 | 0.30 | — |
| | 20 | 0.60 | 0.14 | 0.11 | 0.32 | — |
| | 21 | 0.02 | 0.004 | 0.10 | 0.31 | — |
| | 22 | 0.48 | 0.16 | 0.12 | 0.33 | — |

\* Representations of each element content,
"—" represents below minimum detectable quantity

TABLE 2

| Classification | No. | Cleaning treatment | | Surface properties of copper alloy sheet | | | Properties of copper alloy sheet | | | Peeling temperature of oxidation film ° C. |
|---|---|---|---|---|---|---|---|---|---|---|
| | | Concentration of sulfuric acid | Dipping time | Ra µm | Rmax µm | Rku Degree of peakedness | Tensile strength MPa | Hardness Hv | Electric conductivity % IACS | |
| Inventive example | 1 | 20 | 10 | 0.068 | 0.43 | 2.6 | 580 | 175 | 75 | 400 |
| | 2 | 5 | 10 | 0.050 | 0.53 | 4.8 | 580 | 175 | 75 | 350 |
| | 3 | 50 | 10 | 0.070 | 0.51 | 4.7 | 580 | 175 | 75 | 350 |
| | 4 | 20 | 10 | 0.045 | 0.42 | 2.5 | 520 | 155 | 88 | 400 |
| | 5 | 20 | 10 | 0.067 | 0.48 | 2.7 | 595 | 180 | 73 | 400 |
| | 6 | 20 | 10 | 0.049 | 0.42 | 2.6 | 540 | 160 | 85 | 400 |
| | 7 | 20 | 10 | 0.076 | 0.45 | 3.0 | 565 | 170 | 80 | 390 |
| | 8 | 20 | 10 | 0.050 | 0.40 | 2.5 | 550 | 165 | 83 | 400 |
| | 9 | 10 | 40 | 0.071 | 0.48 | 3.8 | 770 | 235 | 32 | 370 |
| | 10 | 20 | 30 | 0.043 | 0.41 | 2.2 | 630 | 195 | 67 | 410 |

TABLE 2-continued

| Classification | No. | Cleaning treatment | | Surface properties of copper alloy sheet | | | Properties of copper alloy sheet | | | Peeling temperature of oxidation film ° C. |
|---|---|---|---|---|---|---|---|---|---|---|
| | | Concentration of sulfuric acid | Dipping time | Ra μm | Rmax μm | Rku Degree of peakedness | Tensile strength MPa | Hardness Hv | Electric conductivity % IACS | |
| Comparative example | 11 | 30 | 10 | 0.048 | 0.43 | 3.1 | 565 | 170 | 78 | 390 |
| | 12 | 30 | 20 | 0.078 | 0.47 | 3.4 | 600 | 180 | 71 | 380 |
| | 13 | 40 | 5 | 0.070 | 0.52 | 4.3 | 570 | 170 | 77 | 360 |
| | 14 | — | — | 0.044 | 0.64 | 7.3 | 670 | 205 | 53 | 290 |
| | 15 | — | — | 0.056 | 0.63 | 7.4 | 595 | 180 | 73 | 290 |
| | 16 | 3 | 10 | 0.050 | 0.55 | 5.3 | 580 | 175 | 75 | 330 |
| | 17 | 60 | 10 | 0.048 | 0.60 | 5.6 | 580 | 175 | 75 | 320 |
| | 18 | 20 | 80 | 0.072 | 0.59 | 5.7 | 580 | 175 | 75 | 320 |
| | 19 | 20 | 10 | 0.055 | 0.44 | 2.6 | 470 | 135 | 91 | 400 |
| | 20 | 20 | 10 | 0.068 | 0.47 | 2.9 | 555 | 165 | 67 | 390 |
| | 21 | 20 | 10 | 0.077 | 0.43 | 2.5 | 495 | 145 | 90 | 400 |
| | 22 | — | — | — | — | — | — | — | — | — |

Example 2

An example of the present invention will be described below. Cu—Fe—P alloy thin sheets having component composition illustrated in Table 3 were produced with only the tension condition during the final low-temperature annealing being changed variously, as illustrated in Table 4. In each copper alloy thin sheet, the r value parallel to the rolling direction of the thin sheet and the bendability thereof were evaluated. These results are illustrated in Table 4.

Specifically, copper alloys having each component composition illustrated in Table 3 were respectively melted in a coreless furnace, and thereafter ingots with their sizes of 70 mm in thickness×200 mm in width×500 mm in length were produced in the semi-continuous casting process. After the surface of each ingot was subjected to facing and a heat treatment, sheets with a thickness of 16 mm were prepared by being subjected to the hot-rolling, which were quenched in water from a temperature of 650° C. or more. The oxidized scale was removed, and thereafter the primary cold-rolling (intermediate rolling) was performed. The resulting sheet was subjected to facing and the cold-rolling with the intermediate annealing therebetween, and thereafter subjected to the final low-temperature annealing at a temperature of 400° C., allowing a copper alloy sheet with a thickness of 0.15 mm to be obtained, the sheet corresponding to the thinning of lead frames.

The minimum reduction ratio per one pass in the final cold-rolling, and the tension applied to the sheet during the final low-temperature annealing, are illustrated in Table 4. The r values of the copper alloy thin sheets, which are parallel to the rolling direction of the sheet, were controlled by changing variously only the reduction ratio per one pass in the final cold-rolling and the tension during the final low-temperature annealing.

In each copper alloy sheet illustrated in Table 3, the remaining element other than the described elements is Cu, and as other impurity elements, a total content of Hf, Th, Li, Na, K, Sr, Pd, W, S, Si, C, Nb, Al, V, Y, Mo, Pb, In, Ga, Ge, As, Sb, Bi, Te, B, and misch metal was less than 0.1 mass %.

In the case where one or more elements selected from Mn, Mg, and Ca were contained, a total content thereof was to be within the range of 0.0001 to 1.0 mass %; and in the case where one or more elements selected from Zr, Ag, Cr, Cd, Be, Ti, Co, Ni, Au, and Pt were contained, a total content thereof was to be within the range of 0.001 to 1.0 mass %; and further a total content of these whole elements was to be 1.0 mass % or less.

In each example, a sample was taken from each copper alloy sheet thus obtained, such that tensile tests, measurement of electric conductivity, and flexural tests were conducted. These results are also illustrated in Table 4.

(Tensile Test)

In the tensile tests, tensile strength, 0.2 proof stress, and r value, were measured by using the universal tester 5882 made by Instron, under the afore-mentioned conditions for measuring the r value, that is, at a fixed tension speed of 10.0 mm/min, GL of 50 mm, and at room temperature.

(Measurement of Electric Conductivity)

After the copper alloy sheet sample was processed into a slip-shaped test piece with a size of 10 mm in width×300 mm in length by milling and an electric resistance thereof was measured with a double bridge resistance meter, the electric conductivity thereof was calculated by an average cross-sectional area method.

(Test for Evaluating Bendability)

Flexural tests of the copper alloy sheet samples were conducted in accordance with the technical standard set by the Japan Copper and Brass Association. Sheet samples with 10 mm in width×30 mm in length were taken out, and occurrence of a crack in the bending portion was observed by an optical microscope with 50× magnification, while performing the Good Way bending (bending axis is perpendicular to the rolling direction) on the sheet sample. Thereby, a ratio R/t of the minimum bending radius R at which a crack does not occur, to the thickness t (0.15 mm) was determined. As R/t is smaller, the bendability is better. However, as a sheet has high strength, the bendability thereof is necessarily decreased; hence, it is needed that a copper alloy sheet used in semiconductor materials for lead frames or the like, has R/t of less than 1.5 in the case where the hardness is within the range of 150 to 200 Hv, and has R/t of less than 2.0 in the case where the hardness is 200 Hv or more. In the case where the hardness is less than 150 Hv, which is too low and out of the range specified by the present invention, R/t is needed to be less than 0.5.

As is clear from Tables 3 and 4, each of Inventive Examples 31 to 43 that are copper alloys having component composition within the range specified by the present invention, has high strength with tensile strength of 500 MPa or more and hardness of 150 Hv or more. Furthermore, each r value thereof parallel to the rolling direction is 0.3 or more due to the preferable tension applied to the sheets during the final continuous annealing. Accordingly, Inventive Examples 31 to 43 are excellent in the bendability as semiconductor base materials.

On the other hand, in Comparative Examples 44 and 45, tension was not applied to the sheets during the final continuous annealing. Consequently, although Comparative Examples 44 and 45 have high strength in which the tensile strength is 500 MPa or more and the hardness is 150 Hv or more, which are specified by the present invention, r values parallel to the rolling direction of the sheets are less than 0.3. Accordingly, Comparative Examples 44 and 45 have poor bendability as semiconductor base materials.

An Fe content of Comparative Example 46 is out of the lower limit of 0.01%, and therefore Comparative example 46 has too poor strength enough to be used as a semiconductor base material, while having r value parallel to the rolling direction of the sheet of 0.3 or more.

An Fe content of Comparative Example 47 is out of the higher limit of 5.0%, and therefore Comparative Example 47 has poor bendability for the strength. In addition, the electric conductivity is remarkably low for the strength as compared to the same strength level of Inventive Examples, and hence cannot be used as a semiconductor.

A P content of Comparative Example 48 is out of the lower limit of 0.01%, and therefore cannot be used as a semiconductor base material regarding this point, while the r value parallel to the rolling direction of the sheet is 0.3 or more.

A P content of Comparative Example 49 is out of the higher limit of 0.15%, and a crack occurred during the hot-rolling, and therefore trial production was stopped at the time.

In Comparative Example 50, the minimum reduction ratio per one pass in the final cold-rolling is less than 20%. Therefore, the r value parallel to the rolling direction of the sheet is less than 0.3, while the sheet has a component composition within the range specified by the present invention, and therefore Comparative Example 50 has poor bendability.

From the above results, the critical importance of the component composition and the r value of a copper alloy sheet of the present invention, which are for having excellent bendability in addition to high strength, can be supported; and the importance of the preferred production conditions for obtaining the r value and the high strength can also be supported.

TABLE 3

| Classification | No. | Component composition of copper alloy sheet (Remainder: Cu and impurities) | | | | |
|---|---|---|---|---|---|---|
| | | Fe | P | Sn | Zn | Others |
| Inventive example | 31 | 0.17 | 0.056 | 0.022 | 0.030 | — |
| | 32 | 0.16 | 0.056 | 0.63 | 0.058 | — |
| | 33 | 0.030 | 0.010 | — | — | — |
| | 34 | 0.49 | 0.14 | — | — | — |
| | 35 | 0.17 | 0.059 | 0.005 | — | — |
| | 36 | 0.10 | 0.034 | 5.0 | — | — |
| | 37 | 0.17 | 0.060 | 0 | 0.005 | — |
| | 38 | 0.15 | 0.051 | 0 | 3.0 | — |
| | 39 | 0.18 | 0.058 | 0.020 | 0.028 | Mn: 0.003 |
| | 40 | 0.17 | 0.060 | 0.024 | 0.030 | Cr: 0.005 |
| | 41 | 0.17 | 0.057 | 0.022 | 0.033 | Ca: 0.001, Ti: 0.010 |
| | 42 | 0.18 | 0.060 | 0.025 | 0.025 | Mg: 0.050, Al: 0.003 |
| | 43 | 0.25 | 0.080 | — | — | Ni: 0.10, Si: 0.002 |
| Comparative example | 44 | 0.17 | 0.056 | 0.022 | 0.030 | — |
| | 45 | 0.16 | 0.056 | 0.63 | 0.058 | — |
| | 46 | 0.004 | 0.010 | — | — | — |
| | 47 | 0.60 | 0.14 | — | — | — |
| | 48 | 0.020 | 0.004 | — | — | — |
| | 49 | 0.48 | 0.16 | — | — | — |
| | 50 | 0.17 | 0.056 | 0.022 | 0.030 | — |

* Representations of each element content,
"—" represents below minimum detectable quantity

TABLE 4

| Classification | No. | Minimum reduction ratio in final cold-rolling % | Tension during final low-temperature continuous annealing kgf/mm² | Properties of copper alloy sheet | | | | |
|---|---|---|---|---|---|---|---|---|
| | | | | Tensile strength MPa | Hardness Hv | Electric conductivity % IACS | γ value | Bendability R/t |
| Inventive example | 31 | 25 | 3 | 560 | 165 | 83 | 0.38 | 1.00 |
| | 32 | 30 | 4 | 665 | 205 | 58 | 0.43 | 1.33 |
| | 33 | 30 | 3 | 505 | 150 | 90 | 0.40 | 0.67 |
| | 34 | 25 | 2 | 590 | 175 | 78 | 0.36 | 1.33 |
| | 35 | 30 | 3 | 545 | 160 | 85 | 0.38 | 1.00 |
| | 36 | 30 | 3 | 750 | 230 | 35 | 0.41 | 1.67 |
| | 37 | 20 | 6 | 535 | 160 | 86 | 0.43 | 0.83 |
| | 38 | 30 | 3 | 620 | 190 | 70 | 0.40 | 1.33 |
| | 39 | 30 | 1 | 575 | 170 | 80 | 0.36 | 1.00 |
| | 40 | 30 | 2 | 565 | 165 | 81 | 0.37 | 1.00 |
| | 41 | 30 | 0.5 | 555 | 165 | 82 | 0.34 | 1.00 |
| | 42 | 30 | 3 | 590 | 175 | 77 | 0.39 | 1.33 |
| | 43 | 30 | 3 | 580 | 170 | 79 | 0.40 | 1.00 |
| Comparative example | 44 | 25 | 0 | 550 | 160 | 84 | 0.28 | 2.00 |
| | 45 | 20 | 0 | 650 | 200 | 59 | 0.27 | 2.67 |
| | 46 | 25 | 1 | 460 | 130 | 90 | 0.32 | 0.67 |
| | 47 | 20 | 1 | 540 | 160 | 68 | 0.35 | 2.00 |
| | 48 | 20 | 2 | 485 | 140 | 91 | 0.34 | 0.67 |
| | 49 | — | — | — | — | — | — | — |
| | 50 | 15 | 1 | 555 | 165 | 83 | 0.28 | 2.00 |

Example 3

An example of the present invention will be described below. Cu—Fe—P alloy sheets were produced in which homogenization heat treatments, temperatures at the start of cooling with water after the hot-rolling, temperatures of the intermediate annealing, and line speeds during the final continuous annealing or the like were variously changed. In each copper alloy sheet, the tensile properties such as the tensile modulus and the ratio of the uniform elongation to the total elongation, or the tensile strength, the hardness, the electric conductivity, and the shear plane ratio surface or the like, were evaluated. These results are illustrated in Table 5.

Specifically, copper alloys having each component composition illustrated in Table 5 were respectively melted in a coreless furnace or an air melting furnace, and thereafter ingots with their sizes of 70 mm in thickness×200 mm in width×500 mm in length were produced the semi-continuous casting process.

After the surface of each ingot was subjected to facing and a homogenization heat treatment under the conditions (temperature×period) illustrated in Table 6, sheets with a thickness of 16 mm were prepared by being subjected to the hot-rolling at a temperature of 950° C., which were quenched in water from the starting temperatures illustrated in Table 6. The oxidized scale was removed, and thereafter the primary cold-rolling (intermediate rolling) was performed. The resulting sheet was subjected to facing, and thereafter the final cold-rolling was performed in which 4 passes of the cold-rolling were performed with the intermediate annealing therebetween, the intermediate annealing being performed for 10 hours at the temperatures illustrated in Table 6. Thereby, a copper alloy sheet with a thickness of 0.15 mm that corresponds to the thinning of lead frames, was obtained. The copper alloy sheets were subjected to the final annealing in the continuous annealing under the conditions in which a temperature was 350° C. and line speed are illustrated in Table 6, and thereby product copper alloy sheets were obtained.

In each copper alloy illustrated in Table 5, the remaining element other than the described elements is Cu, and as other impurity elements, a total content of Hf, Th, Li, Na, K, Sr, Pd, W, Si, Nb, Al, V, Y, Mo, In, Ga, Ge, As, Sb, Bi, Te, B, and misch metal was less than 0.1 mass %.

In the case where one or more elements selected from Mn, Mg, and Ca were contained, a total content thereof was to be within the range of 0.0001 to 1.0 mass %; and in the case where one or more elements selected from Zr, Ag, Cr, Cd, Be, Ti, Co, Ni, Au, and Pt were contained, a total content thereof was to be within the range of 0.001 to 1.0 mass %; and further a total content of these whole elements was to be 1.0 mass % or less.

In each example, a test piece (sample) was taken from each copper alloy sheet thus obtained in a way that the longitudinal direction of the test piece was to be the width direction of the alloy sheet, which was perpendicular to the rolling direction of the alloy sheet; and thereafter the properties such as tensile modulus, ratio of the uniform elongation to the total elongation, tensile strength, hardness, electric conductivity, and shear plane ratio or the like, were evaluated. These results are illustrated in Table 6.

(Measurement of Shear Plane Ratio)

The stampability of a copper alloy sheet is evaluated by a shear plane ratio of a lead cross section formed by the press stamping that simulates the lead stamping of a copper alloy sheet. When the shear plane ratio is 75% or less, the stampability can be evaluated as good. The evaluation method by the shear plane ratio can evaluate the demanded stampability more properly than that of the press stampability in which a lead is stamped through a copper alloy sheet and a burr height occurring at the time is measured.

Figure 2:
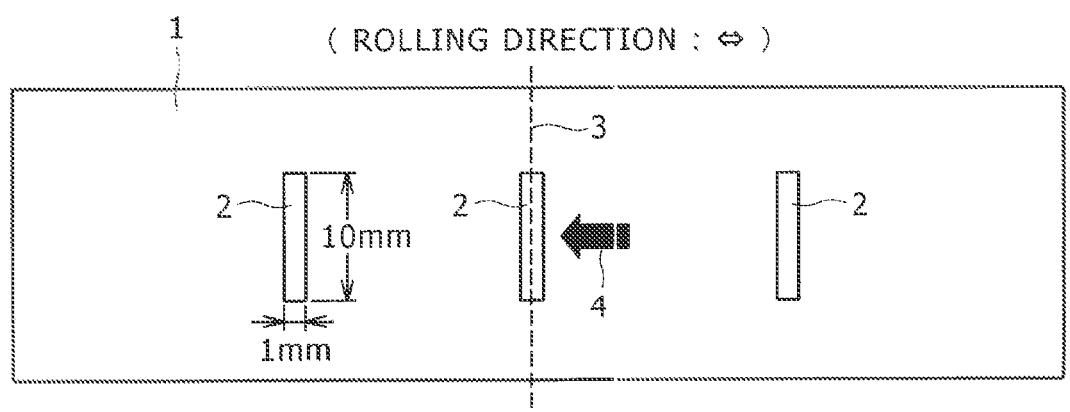
FIG. 2 is an illustrative diagram illustrating a method for measuring a shear plane ratio.

In the press stamping tests, leads one of which has a size of 1 mm in width×10 mm in length, which is illustrated in FIG. 2, are sequentially stamped through a copper alloy sheet (test piece) 1 by using a stamping press (clearance: 5%) and a lubricating oil G-6316 made by NIHON KOHSAKUYU CO., LTD, as stamped holes 2 in which the width direction of the alloy sheet, which is perpendicular to the rolling direction of the alloy sheet, is to be the longitudinal direction of the test piece.

Subsequently, the stamped hole 2 was cut at its center along the longitudinal direction thereof (cut portion is represented by the dot line 3), and then a shear plane in the stamped hole 2 was determined by observing the cut cross section of the hole from the arrow 4 direction, and by image analysis of a surface picture of the cut cross section taken by an optical microscope. A shear ratio is specified by a ratio of the shear plane area (shear plane area/cut cross sectional area), wherein the cut cross sectional area was obtained by multiplying the thickness of the copper alloy sheet 0.15 mm by the measurement width 0.5 mm, and the shear plane area was to be a shear plane area within the range of the measurement width 0.5 mm. Three holes were stamped out per one sample and three measurements at 3 points were carried out for each hole (total 9 points), thereafter a mean value thereof was calculated.

(Measurement of Hardness)

Hardness of the copper alloy sheet sample was measured at 3 points that are arbitrarily selected, with a micro Vickers hardness tester by applying a load of 0.5 kg, and an average value thereof was taken as the hardness of the sample.

(Measurement of Electric Conductivity)

After the copper alloy sheet sample was processed into a slip-shaped test piece with a size of 10 mm in width×300 mm in length by milling and an electric resistance thereof was measured with a double bridge resistance meter, the electric conductivity thereof was calculated by an average cross-sectional area method.

As is clear from Tables 5 and 6, each of Inventive Examples 51 to 61 within the range specified by the present invention, has a component composition within the range specified by the present invention. And, each of Inventive Examples 51 to 61 was produced under the production conditions in which a homogenization heat treatment, a temperature at the start of cooling with water after the hot-rolling, a line speed during the final continuous annealing or the like, were within the preferable ranges. Accordingly, each of Inventive Examples 51 to 61 has the tensile modulus more than 120 GPa and the ratio of the uniform elongation/total elongation of less than 0.5.

As a result, each of Inventive Examples 51 to 61 has a relatively high electric conductivity for the high strength in which the tensile modulus is 500 MPa or more and the hardness is 150 Hv or more; and the shear plane ratio is 75% or less. Moreover, each of them is excellent in the stampability.

However, Inventive Example 53 an Fe content of which is close to the lower limit, and Inventive Example 55a P content of which is close to the lower limit, have the relatively lower strength as compared to those of other Inventive Examples 51 and 52 or the like. Inventive Example 54 an Fe content of which is close to the higher limit, and Inventive Example 56a P content of which is close to the higher limit, have the relatively larger shear plane ratio and relatively smaller electric conductivity as compared to Inventive Examples 51 and 52.

On the other hand, each of Comparative Examples 62 to 67 was produced under the production conditions in which a homogenization heat treatment, a temperature at the start of cooling with water after the hot-rolling, a line speed during the final continuous annealing or the like, were out of the preferable ranges. Accordingly, each of Comparative Examples 62 to 67 has the low tensile modulus of 120 GPa or less, or the ratio of the uniform elongation/total elongation of 0.5 or more. As a result, each of Comparative Examples 62 to 67 has the shear plane ratio of more than 75%, and therefore has the remarkably deteriorated stampability.

In Comparative Example 62, the period of the homogenization heat treatment is too short. In Comparative Example 63, the temperature during the homogenization heat treatment is too low. In Comparative Example 64, the temperature at the start of cooling with water after the hot-rolling is too high. In Comparative Example 65, the temperature at the start of the cooling with water after the hot-rolling is too low. In Comparative Example 66, the temperature at the intermediate annealing is too high. In Comparative Example 67, the line speed during the final continuous annealing is too slow.

The component composition of each of Comparative Examples 68 to 71 is out of the range specified by the present invention, while each of them was produced in the preferable production conditions. Accordingly, each of Comparative Examples 68 to 71 has the low tensile modulus of 120 GPa or less, and the ratio of the uniform elongation/total elongation of 0.5 or more. As a result, each of Comparative Examples 68 to 71 has the shear plane ratio of more than 75%, and therefore has the remarkably deteriorated stampability.

In Comparative Example 68, an Fe content is out of the lower limit of 0.01%. Therefore, Comparative Example 68 has the high shear plane ratio, and therefore has the deteriorated stampability and the insufficient strength.

In Comparative Example 69, an Fe content is out of the higher limit of 5.0%. Therefore, Comparative Example 68 has the high shear plane ratio, and therefore has the deteriorated stampability and the insufficient strength.

In the copper alloy of Comparative Example 70, a P content is out of the lower limit of 0.01%. Therefore, Comparative Example 70 has the high shear plane ratio, and therefore has the deteriorated stampability and the insufficient strength.

In the copper alloy of Comparative Example 71, a P content is out of the higher limit of 0.15%. Therefore, a crack occurred during the hot-rolling.

From the above results, the critical importance of the component composition of a copper alloy sheet of the present invention, and the tensile properties thereof such as tensile modulus and uniform elongation/total elongation, which provide the excellent stampability in addition to the high strength, can be supported; and the importance of the preferred production conditions for obtaining such tensile properties can also be supported.

TABLE 5

| Classification | No. | Component composition of copper alloy sheet (Remainder: Cu and impurities) | | | | |
|---|---|---|---|---|---|---|
| | | Fe | P | Zn | Sn | Others |
| Inventive example | 51 | 0.17 | 0.061 | 0.070 | 0.035 | — |
| | 52 | 0.17 | 0.056 | 0.062 | 1.0 | — |
| | 53 | 0.03 | 0.060 | — | — | — |
| | 54 | 0.47 | 0.060 | — | — | — |
| | 55 | 0.32 | 0.030 | — | — | — |
| | 56 | 0.32 | 0.13 | — | — | — |
| | 57 | 0.17 | 0.060 | 0.058 | 0.56 | Ni: 0.005 |
| | 58 | 0.17 | 0.061 | 0.60 | 0.10 | Mn: 0.01, Ca: 0.003 |
| | 59 | 0.17 | 0.060 | 0.085 | 0.020 | Ni: 0.01, Mn: 0.005, Al: 0.005 |
| | 60 | 0.17 | 0.061 | 0.10 | 0.035 | Ti: 0.005, Ca: 0.01 |
| | 61 | 0.17 | 0.058 | 0.096 | 0.020 | Mg: 0.01, Si: 0.005 |
| Comparative example | 62 | 0.15 | 0.050 | 0.070 | 0.030 | — |
| | 63 | 0.15 | 0.050 | 0.070 | 0.025 | — |
| | 64 | 0.17 | 0.061 | 0.070 | 0.035 | — |
| | 65 | 0.17 | 0.061 | 0.070 | 0.035 | — |
| | 66 | 0.17 | 0.061 | 0.070 | 0.035 | — |
| | 67 | 0.17 | 0.061 | 0.070 | 0.035 | — |
| | 68 | 0.006 | 0.058 | 0.065 | 0.020 | — |
| | 69 | 0.55 | 0.061 | 0.065 | 0.020 | — |
| | 70 | 0.17 | 0.007 | 0.10 | 0.024 | — |
| | 71 | 0.17 | 0.17 | 0.10 | 0.025 | — |

* Representations of each element content, "—" represents below minimum detectable quantity

TABLE 6

| Classification | No. | Production conditions for producing copper alloy sheets | | | | Tensile properties | | Properties of copper alloy sheet | | | |
|---|---|---|---|---|---|---|---|---|---|---|---|
| | | Homogenization heating conditions prior to hot-rolling ° C. × h | Temperature at the start of cooling with water after hot-rolling ° C. | Temperature at intermediate annealing ° C. | Line speed during final annealing m/min | Modulus GPa | Uniform elongation/ total elongation | Tensile strength MPa | Hardness Hv | Electric conductivity % IACS | Shear plane ratio % |
| Inventive example | 51 | 950° C. × 4 h | 780 | 400 | 50 | 128 | 0.28 | 560 | 165 | 82 | 73 |
| | 52 | 950° C. × 4 h | 750 | 380 | 50 | 146 | 0.16 | 670 | 205 | 52 | 65 |
| | 53 | 920° C. × 4 h | 720 | 420 | 30 | 122 | 0.45 | 510 | 150 | 88 | 75 |
| | 54 | 950° C. × 4 h | 750 | 400 | 50 | 124 | 0.20 | 600 | 180 | 74 | 70 |
| | 55 | 950° C. × 4 h | 750 | 400 | 50 | 128 | 0.26 | 575 | 170 | 79 | 72 |
| | 56 | 950° C. × 4 h | 750 | 400 | 50 | 135 | 0.23 | 585 | 175 | 77 | 71 |
| | 57 | 950° C. × 4 h | 750 | 380 | 80 | 158 | 0.16 | 700 | 220 | 51 | 64 |
| | 58 | 950° C. × 4 h | 750 | 400 | 80 | 150 | 0.24 | 610 | 185 | 69 | 70 |
| | 59 | 950° C. × 4 h | 750 | 420 | 50 | 145 | 0.40 | 530 | 155 | 85 | 74 |

TABLE 6-continued

| Classification | No. | Homogenization heating conditions prior to hot-rolling °C. × h | Temperature at the start of cooling with water after hot-rolling °C. | Temperature at intermediate annealing °C. | Line speed during final annealing m/min | Modulus GPa | Uniform elongation/ total elongation | Tensile strength MPa | Hardness Hv | Electric conductivity % IACS | Shear plane ratio % |
|---|---|---|---|---|---|---|---|---|---|---|---|
| | | | | | | Tensile properties | | Properties of copper alloy sheet | | | |
| | 60 | 920° C. × 8 h | 720 | 400 | 50 | 125 | 0.25 | 570 | 170 | 80 | 72 |
| | 61 | 950° C. × 4 h | 750 | 380 | 50 | 141 | 0.18 | 640 | 195 | 62 | 67 |
| Comparative | 62 | 950° C. × 1 h | 780 | 420 | 50 | 115 | 0.42 | 485 | 140 | 88 | 77 |
| example | 63 | 880° C. × 8 h | 720 | 400 | 50 | 104 | 0.36 | 490 | 145 | 87 | 76 |
| | 64 | 970° C. × 4 h | 820 | 400 | 50 | 125 | 0.55 | 545 | 160 | 80 | 76 |
| | 65 | 920° C. × 4 h | 680 | 400 | 50 | 117 | 0.52 | 480 | 140 | 88 | 78 |
| | 66 | 950° C. × 4 h | 750 | 450 | 50 | 133 | 0.58 | 485 | 140 | 87 | 77 |
| | 67 | 950° C. × 4 h | 750 | 400 | 5 | 116 | 0.54 | 475 | 135 | 88 | 78 |
| | 68 | 950° C. × 4 h | 750 | 400 | 50 | 116 | 0.53 | 480 | 140 | 85 | 77 |
| | 69 | 950° C. × 4 h | 750 | 400 | 50 | 118 | 0.38 | 495 | 145 | 83 | 76 |
| | 70 | 950° C. × 4 h | 750 | 400 | 50 | 115 | 0.35 | 490 | 145 | 85 | 76 |
| | 71 | 950° C. × 4 h | 750 | 400 | 50 | — | — | — | — | — | — |

Example 4

An example of the present invention will be described below. Cu—Fe—P alloy thin sheets having various contents of C, 0, and H were produced by changing melting temperatures in an air melting furnace, and average cooling rates (solidification rates) from the start of casting to 600° C. In each copper alloy thin sheet, the tensile strength, the hardness, the electric conductivity, and the platability or the like were evaluated. These results are illustrated in Table 8.

Specifically, each of the copper alloys having each component composition illustrated in Table 7 was ingoted by changing the melting temperatures, and the average cooling rates from the start of casting to 600° C. as illustrated in Table 8. Melting was performed by using a coreless furnace that is an air melting furnace, and ingots with their sizes of 70 mm in thickness×200 mm in width×500 mm in length were produced in the semi-continuous casting process.

After the surface of each ingot was subjected to facing and a heat treatment, sheets with a thickness of 16 mm were prepared by being subjected to the hot-rolling at a temperature of 950° C., which were quenched in water from a temperature of 750° C. or more. The oxidized scale was removed, and thereafter the primary cold-rolling (intermediate rolling) was performed. The resulting sheet was subjected to facing and the final cold-rolling in which 4 passes of cold-rolling with the intermediate annealing therebetween, were performed, and thereafter subjected to the final low-temperature annealing at a temperature of 350° C. for 20 seconds, allowing a copper alloy sheet with a thickness of 0.15 mm to be obtained, the sheet corresponding to the thinning of lead frames.

In each copper alloy sheet illustrated in Table 7, the remaining element other than the described elements is Cu, and as other impurity elements, a total content of Hf, Th, Li, Na, K, Sr, Pd, W, Si, Nb, Al, V, Y, Mo, In, Ga, Ge, As, Sb, Bi, Te, B, and misch metal was less than 0.1 mass %.

In the case where one or more elements selected from Mn, Mg, and Ca were contained, a total content thereof was to be within the range of 0.0001 to 1.0 mass %; and in the case where one or more elements selected from Zr, Ag, Cr, Cd, Be, Ti, Co, Ni, Au, and Pt were contained, a total content thereof was to be within the range of 0.001 to 1.0 mass %; and further a total content of these whole elements was to be 1.0 mass % or less.

An O content was determined by extracting O in a sample with an inert gas fusion method and by analyzing the O with a combustion-infrared absorption method, with the use of EMGA-650A tester made by HORIBA, Ltd. in accordance with JIS Z2613. An H content was determined by extracting H in a sample with an inert gas fusion method and by analyzing the H with a thermal conductivity method, with the use of RH-402 tester made by LECO Corporation, in accordance with JIS Z2614. A C content was determined by extracting C in a sample by heating the sample in oxygen atmosphere and by analyzing the C with a combustion-infrared absorption method, with the use of EMIA 610 tester made by HORIBA, Ltd. in accordance with JIS Z2615.

In each example, a sample was taken from each copper alloy sheet thus obtained, and the tensile strength, the hardness, the electric conductivity, the platability or the like of each sample, were evaluated. These results are illustrated in Table 8.

(Evaluation of Platability)

Figure 3:
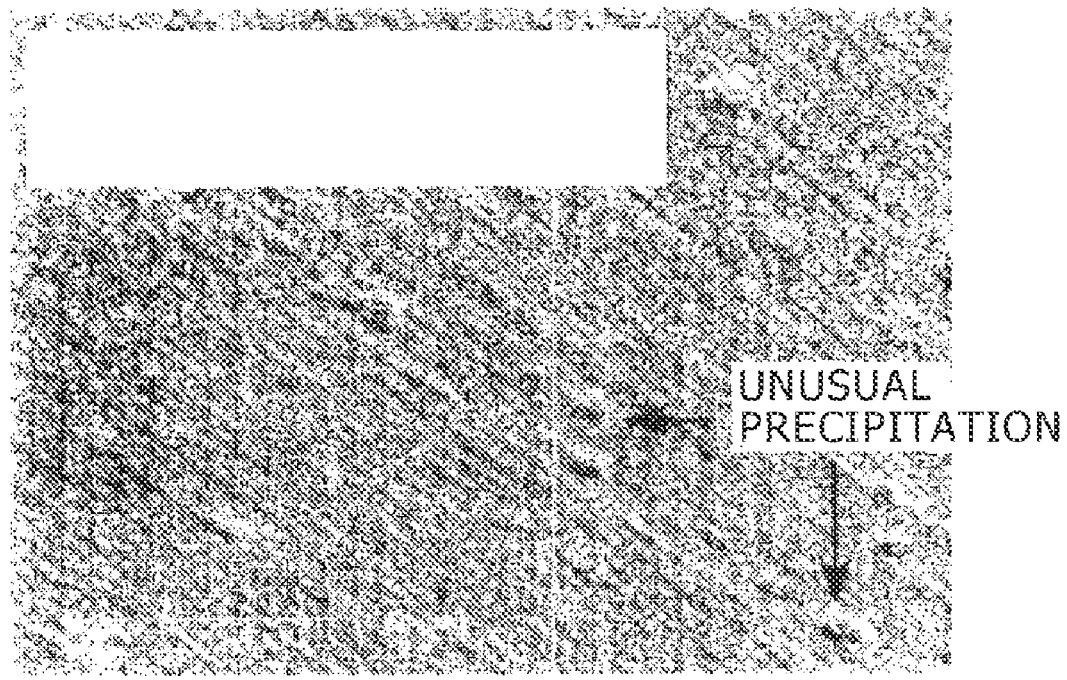
FIG. 3 is a picture of the surface of a copper alloy sheet illustrating unusual precipitation of the plating, which is a substitute for a drawing.

In each copper alloy sheet, a sample with a size of 25 mm×60 mm was taken from the obtained copper alloy sheet, and subsequently the sample was plated with Ag in which the actual plating process for plating lead frames was simulated. Thereafter, the front and back face of the plated face were observed within the range of 10 cm$^2$ near the center of the sample, respectively, with the use of a stereo microscope (×40), such that the number of the unusual precipitations (projections) of the plating occurring within the above range was measured, the unusual precipitation being observed as a projection of the plated layer as illustrated in FIG. 3. The case where the occurrence number was less than 2 per cm$^2$ was evaluated as good, while the case where the occurrence number is 2 or more per cm$^2$ was evaluated as bad, because there was a fear that a bonding defect could be induced, and therefore could not be used as a lead frame. The above Ag plating was performed after the front and back face of a sample that had been subjected to a pretreatment such as electrolytic degreasing, acid pickling, and water cleaning, was subjected to Cu basic electroplating in a commercially available Cu plating solution bath. The Cu basic plating was performed under the conditions as follows: temperature is 60 to 65° C.; current density is 5 A/dm$^2$; and processing time is 10 seconds. The Ag electroplating was performed under the conditions as follows: temperature is 60 to 65° C.; current density is 7 A/dm$^2$; and processing time is 60 seconds.

(Measurement of Hardness)

Hardness of the copper alloy sheet sample was measured at 3 points of the sample with a micro Vickers hardness tester, by applying a load of 0.5 kg, and an average value thereof was taken as the hardness of the sample.

(Measurement of Electric Conductivity)

After the copper alloy sheet sample was processed into a slip-shaped test piece with a size of 10 mm in width×300 mm in length by milling and an electric resistance thereof was measured with a double bridge resistance meter, the electric conductivity thereof was calculated by an average cross-sectional area method.

As is clear from Tables 7 and 8, each of Inventive Examples 81 to 95 that are copper alloys having component composition within the range specified by the present invention, is produced under the conditions in which a melting temperature of the melt in an air melting furnace, and an average cooling rate from the start of casting to 600° C., are proper. Accordingly, the contents of C as well as Fe and P are within the range specified by the present invention.

As a result, each of Inventive Examples 81 to 95 has a relatively high electric conductivity for the high strength in which the tensile strength is 500 MPa or more and the hardness is 150 Hv or more, and also has the excellent platability, even when O and H are present to some extent.

On the other hand, either of Comparative Examples 96 and 97 is produced under the conditions in which a melting temperature in an air melting furnace is too low, or an average cooling rate from the start of casting to 600° C. is too small, and a C content is too small. As a result, either of Comparative Examples 96 or 97 has the decreased platability as compared to Inventive Examples, while the contents of O and H are within the range specified by the present invention.

The contents of O and H of either of Comparative Examples 98 and 99 are too large. As a result, either of Comparative Examples 98 or 99 has the remarkably decreased strength and platability as compared to Inventive Examples 84 and 85 that have likewise high contents of O and H which are at the high level of the range, despite a large C content.

In Comparative Example 100, an Fe content is too small. Therefore, Comparative Example 100 has the decreased strength and hardness, while a C content is within the range specified by the present invention and has the excellent platability.

In the copper alloy of Comparative Example 101, an Fe content is too large. Therefore, Comparative Example 101 has the decreased strength, hardness, and electric conductivity, while a C content is within the range specified by the present invention.

In Comparative Example 102, a P content is too small. Therefore, Comparative Example 102 has the decreased strength, hardness, and electric conductivity, while a C content is within the range specified by the present invention and has the excellent platability.

In the copper alloy of Comparative Example 103, a P content is too large. Therefore, a crack occurred at the end of the sheet during the hot-rolling.

In Comparative Example 104, the melting temperature in an air melting furnace is high and a C content is too large. As a result, Comparative Example 104 has the decreased platability as compared to Inventive Examples, while the contents of O and H are within the range specified by the present invention.

From the above results, the critical importance of the C content or the like in order to make the high strength compatible with the excellent platability by which the unusual precipitation of the plating is prevented, can be supported; and the importance of the preferred production conditions for obtaining such structure, can also be supported.

TABLE 7

| | | Component composition of copper alloy sheet (Remainder: Cu and impurities: mass %, however, with respect to C, O, H, S, and Pb, ppm) | | | | | | | | |
|---|---|---|---|---|---|---|---|---|---|---|
| Classification | Alloy No. | Fe | P | Zn | Sn | C | O | H | S | Pb | Others |
| Inventive example | 81 | 0.29 | 0.11 | 0.29 | 0.020 | 3 | 9 | 0.4 | 10 | 7 | — |
| | 82 | 0.29 | 0.11 | 0.29 | 0.020 | 8 | 12 | 0.3 | 8 | 12 | — |
| | 83 | 0.29 | 0.12 | 0.29 | 0.56 | 8 | 13 | 0.2 | 8 | 9 | — |
| | 84 | 0.33 | 0.12 | 0.60 | 0.025 | 10 | 40 | 0.2 | 6 | 5 | — |
| | 85 | 0.27 | 0.09 | 0.10 | 1.0 | 10 | 8 | 1.0 | 7 | 7 | — |
| | 86 | 0.05 | 0.10 | — | — | 7 | 12 | 0.3 | 8 | 14 | — |
| | 87 | 0.46 | 0.11 | — | — | 7 | 10 | 0.3 | 12 | 8 | — |
| | 88 | 0.29 | 0.027 | — | — | 8 | 14 | 0.2 | 7 | 12 | — |
| | 89 | 0.29 | 0.14 | — | — | 6 | 9 | 0.4 | 10 | 6 | — |
| | 90 | 0.29 | 0.11 | 0.29 | 0.020 | 8 | 12 | 0.2 | 8 | 10 | Co: 0.003 |
| | 91 | 0.29 | 0.11 | 0.29 | 0.020 | 8 | 10 | 0.2 | 8 | 8 | Ca: 0.002, Ti: 0.005 |
| | 92 | 0.29 | 0.11 | 0.29 | 0.020 | 6 | 12 | 0.2 | 8 | 7 | Mn: 0.003, Ni: 0.001, Au: 0.1 |
| | 93 | 0.29 | 0.11 | 0.29 | 0.020 | 7 | 10 | 0.3 | 10 | 7 | Mg: 0.003, Ag: 0.1 |
| | 94 | 0.29 | 0.11 | 0.29 | 0.020 | 7 | 8 | 0.4 | 9 | 7 | Ca: 0.002, Zr: 0.005 |
| | 95 | 0.40 | 0.14 | 0.30 | 0.020 | 12 | 15 | 0.3 | 8 | 10 | — |
| Comparative example | 96 | 0.29 | 0.11 | 0.29 | 0.020 | 2 | 9 | 0.3 | 7 | 11 | — |
| | 97 | 0.29 | 0.12 | 0.29 | 0.56 | 2 | 13 | 0.2 | 10 | 10 | — |
| | 98 | 0.33 | 0.12 | 0.29 | 0.020 | 10 | 45 | 0.2 | 6 | 8 | — |
| | 99 | 0.33 | 0.12 | 0.29 | 0.020 | 10 | 7 | 1.2 | 10 | 7 | — |
| | 100 | 0.005 | 0.10 | 0.27 | 0.025 | 4 | 15 | 0.2 | 8 | 10 | — |

TABLE 7-continued

Component composition of copper alloy sheet
(Remainder: Cu and impurities: mass %,
however, with respect to C, O, H, S, and Pb, ppm)

| Classification | Alloy No. | Fe | P | Zn | Sn | C | O | H | S | Pb | Others |
|---|---|---|---|---|---|---|---|---|---|---|---|
| | 101 | 0.56 | 0.10 | 0.27 | 0.025 | 6 | 12 | 0.2 | 8 | 7 | — |
| | 102 | 0.29 | 0.005 | 0.28 | 0.025 | 4 | 16 | 0.2 | 8 | 7 | — |
| | 103 | 0.29 | 0.17 | 0.28 | 0.025 | 7 | 11 | 0.3 | 8 | 9 | — |
| | 104 | 0.45 | 0.14 | 0.29 | 0.020 | 17 | 20 | 0.3 | 10 | 10 | — |

* Representations of each element content, "—" represents below minimum detectable quantity

TABLE 8

| Classification | Alloy No. | Alloy No. in Table 1 | Melting temperature °C. | Average cooling rate from the start of casting to 600° C. °C./s | Tensile strength MPa | Hardness Hv | Electric conductivity % IACS | Platability |
|---|---|---|---|---|---|---|---|---|
| Inventive example | 81 | 81 | 1320 | 5.5 | 540 | 160 | 80 | ○ |
| | 82 | 82 | 1330 | 6.0 | 570 | 170 | 75 | ○ |
| | 83 | 83 | 1330 | 6.0 | 690 | 210 | 51 | ○ |
| | 84 | 84 | 1360 | 5.5 | 550 | 165 | 78 | ○ |
| | 85 | 85 | 1360 | 6.0 | 675 | 205 | 50 | ○ |
| | 86 | 86 | 1320 | 6.0 | 525 | 155 | 84 | ○ |
| | 87 | 87 | 1320 | 6.0 | 580 | 175 | 73 | ○ |
| | 88 | 88 | 1320 | 6.0 | 510 | 150 | 86 | ○ |
| | 89 | 89 | 1320 | 6.0 | 595 | 180 | 70 | ○ |
| | 90 | 90 | 1330 | 6.0 | 575 | 175 | 75 | ○ |
| | 91 | 91 | 1330 | 6.0 | 565 | 170 | 77 | ○ |
| | 92 | 92 | 1330 | 6.0 | 580 | 175 | 73 | ○ |
| | 93 | 93 | 1330 | 6.0 | 585 | 180 | 72 | ○ |
| | 94 | 94 | 1330 | 6.0 | 570 | 170 | 76 | ○ |
| | 95 | 95 | 1380 | 6.0 | 625 | 190 | 65 | ○ |
| Comparative example | 96 | 96 | 1250 | 6.0 | 570 | 170 | 75 | X |
| | 97 | 97 | 1310 | 4.0 | 560 | 165 | 77 | X |
| | 98 | 98 | 1360 | 3.5 | 480 | 140 | 87 | X |
| | 99 | 99 | 1360 | 4.0 | 490 | 145 | 85 | X |
| | 100 | 100 | 1330 | 6.0 | 470 | 140 | 88 | ○ |
| | 101 | 101 | 1330 | 6.0 | 490 | 145 | 84 | X |
| | 102 | 102 | 1330 | 6.0 | 460 | 135 | 89 | ○ |
| | 103 | 103 | 1330 | 6.0 | — | — | — | — |
| | 104 | 104 | 1400 | 6.0 | 610 | 185 | 68 | ○ |

The present invention has been described in detail and with reference to the specific embodiments, and it is clear to a person skilled in the art that various modifications and variations can be made without departing from the spirit and the scope of the present invention. The present invention is based on Japanese Unexamined Patent Application (No. 2006-270918) filed Oct. 2, 2006, Japanese Unexamined Patent Application (No. 2006-274309) filed Oct. 5, 2006, Japanese Unexamined Patent Application (No. 2006-311899) filed Nov. 17, 2006, and Japanese Unexamined Patent Application (No. 2006-3111900) filed Nov. 17, 2006, the contents of which are incorporated herein by reference.

INDUSTRIAL APPLICABILITY

As stated above, according to the present invention, a Cu—Fe—P alloy sheet with the high strength that is also provided with the excellent resistance peel off of oxidation film, which is compatible with the high strength, can be provided. As a result, a semiconductor base material in which the adhesion between the resin and the die pad is high in assembling a semiconductor package, and therefore the reliability of the package is high, can be provided. Accordingly, the Cu—Fe—P alloy sheet according to the invention can be used in applications in which the high strength, and the high resistance of peel off of oxidation film or the high reliability of packages, are needed, such as lead frames, connectors, terminals, switches, and relays, as well as lead frames for semiconductor devices, as a material used for miniaturized and lightweight electric and electronic parts.

According to the present invention, a Cu—Fe—P alloy sheet with the high strength that is also provided with the excellent bendability, which is compatible with the high strength, can be provided. As a result, a semiconductor base material with the high reliability can be provided. Accordingly, the Cu—Fe—P alloy sheet according to the invention can be used in applications in which the high strength, and the high resistance of peel off of oxidation film or the high reliability of packages, are needed, such as lead frames, connectors, terminals, switches, and relays, as well as lead frames for semiconductor devices, as a material used for miniaturized and lightweight electric and electronic parts.

According to the present invention, a Cu—Fe—P alloy sheet with the high strength that is also provided with the excellent stampability, which is compatible with the high strength, can be provided. As a result, the Cu—Fe—P alloy sheet according to the present invention can be used in applications in which the high strength and the strict bendability are needed, such as lead frames, connectors, terminals, switches, and relays, as well as lead frames for semiconductor devices, as a material used for miniatuarized and lightweight electric and electronic parts.

Moreover, according to the present invention, a Cu—Fe—P alloy sheet with the high strength that is also provided with the excellent platability, which is compatible with the high strength, can be provided. As a result, the Cu—Fe—P alloy sheet according to the present invention can be used in applications in which the high strength and the strict bendability are needed, such as lead frames, connectors, terminals, switches, and relays, as well as lead frames for semiconductor devices, as a material used for miniaturized and lightweight electric and electronic parts.

The invention claimed is:

1. A copper alloy sheet for electric and electronic parts, comprising:
   0.01 to 0.50 mass % of Fe;
   0.01 to 0.15 mass % of P; and
   a remainder being Cu and inevitable impurities,
   wherein the copper alloy sheet has a centerline average roughness Ra of 0.2 μm or less and a maximum height Rmax of 1.5 μm or less, and Kurtosis Rku of roughness curve is 5.0 or less, in measurement of a surface roughness of the copper alloy sheet in accordance with JIS B0601.

2. The copper alloy sheet for electric and electronic parts according to claim 1, wherein an r value parallel to a rolling direction of the copper alloy sheet is 0.3 or more.

3. The copper alloy sheet for electric and electronic parts according to claim 1, wherein a tensile modulus of the copper alloy sheet is more than 120 GPa, and a ratio of an uniform elongation to a total elongation of the copper alloy sheet is less than 0.50, two measurements being determined by a tensile test using a test piece where a width direction of the copper alloy sheet, which is perpendicular to a rolling direction of the copper alloy sheet, is a longitudinal direction of the test piece.

4. The copper alloy sheet for electric and electronic parts according to claim 1, wherein the copper alloy sheet further comprises 3 to 15 ppm of C, and contents of O and H are adjusted to be 40 ppm or less and 1.0 ppm or less, respectively.

5. The copper alloy sheet for electric and electronic parts according to claim 1, wherein the copper alloy sheet further comprises 0.005 to 5.0 mass % of Sn.

6. The copper alloy sheet for electric and electronic parts according to claim 1, wherein the copper alloy sheet further comprises 0.005 to 3.0 mass % of Zn.

7. The copper alloy sheet for electric and electronic parts according to claim 1, wherein contents of S and Pb of the copper alloy sheet are each adjusted to be 20 ppm or less.

8. The copper alloy sheet for electric and electronic parts according to claim 1, wherein tensile strength of the copper alloy sheet is 500 MPa or more, and hardness of the copper alloy sheet is 150 Hv or more.

9. The copper alloy sheet for electric and electronic parts according to claim 1, wherein the copper alloy sheet further comprises a total content of 0.0001 to 1.0 mass % of one or more elements selected from the group consisting of Mn, Mg, and Ca.

10. The copper alloy sheet for electric and electronic parts according to claim 1, wherein the copper alloy sheet further comprises a total content of 0.001 to 1.0 mass % of one or more elements selected from the group consisting of Zr, Ag, Cr, Cd, Be, Ti, Co, Ni, Au, and Pt.

11. The copper alloy sheet for electric and electronic parts according to claim 1, wherein the copper alloy sheet further comprises a total content of 0.0001 to 1.0 mass % of one or more elements selected from the group consisting of Mn, Mg, and Ca, and wherein the copper alloy sheet further comprises a total content of 0.001 to 1.0 mass % of one or more elements selected from the group consisting of Zr, Ag, Cr, Cd, Be, Ti, Co, Ni, Au, and Pt, and wherein a total content of these contained elements is 1.0 mass % or less.

12. The copper alloy sheet for electric and electronic parts according to claim 1, wherein the copper alloy sheet comprises a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

13. The copper alloy sheet for electric and electronic parts according to claim 1, wherein Kurtosis Rku of roughness curve is 4.5 or less.

14. The copper alloy sheet for electric and electronic parts according to claim 2, wherein the r value parallel to the rolling direction of the copper alloy sheet is 0.35 or more and 0.5 or less.

* * * * *